US012756364B2

(12) United States Patent
Tsinker

(10) Patent No.: US 12,756,364 B2
(45) Date of Patent: Oct. 6, 2026

(54) GYROSCOPE QUADRATURE CANCELLATION

(71) Applicant: InvenSense, Inc., San Jose, CA (US)

(72) Inventor: Vadim Tsinker, San Jose, CA (US)

(73) Assignee: InvenSense, Inc., San Jose, CA (US)

( * ) Notice: Subject to any disclaimer, the term of this patent is extended or adjusted under 35 U.S.C. 154(b) by 464 days.

(21) Appl. No.: 18/483,661

(22) Filed: Oct. 10, 2023

(65) Prior Publication Data

US 2025/0119104 A1 Apr. 10, 2025

(51) Int. Cl.
*H03F 3/04* (2006.01)
*G01C 19/58* (2006.01)
*H03F 1/26* (2006.01)

(52) U.S. Cl.
CPC ............... *H03F 1/26* (2013.01); *G01C 19/58* (2013.01); *H03F 2200/372* (2013.01)

(58) Field of Classification Search
CPC ................. H03F 1/26; H03F 2200/372; H03F 2203/45512; H03F 3/45475; G01C 19/58; G01C 19/5776
See application file for complete search history.

(56) References Cited

U.S. PATENT DOCUMENTS

| | | | | |
|---|---|---|---|---|
| 8,638,249 | B2 * | 1/2014 | Kropfitsch | H03G 7/06 330/109 |
| 11,047,684 | B2 | 6/2021 | Kraver | |
| 11,262,212 | B2 | 3/2022 | Furuta et al. | |
| 11,719,540 | B2 | 8/2023 | Hu et al. | |
| 12,506,456 | B2 * | 12/2025 | Mazzarella | H03F 3/45973 |
| 2013/0031950 | A1 * | 2/2013 | Donadel | G01C 19/5776 73/1.77 |
| 2022/0128360 | A1 | 4/2022 | Hu et al. | |
| 2023/0102160 | A1 | 3/2023 | Granata | |

FOREIGN PATENT DOCUMENTS

EP 2650643 B1 12/2019

* cited by examiner

*Primary Examiner* — Khanh V Nguyen
(74) *Attorney, Agent, or Firm* — Van Hoven PC; Joshua Van Hoven

(57) ABSTRACT

A microelectromechanical system (MEMS) gyroscope includes a MEMS structure that outputs a capacitive signal that includes both a Coriolis signal used to determine an angular velocity and a quadrature signal 90 degrees out-of-phase with the Coriolis signal. A capacitance to voltage (C2V) amplifier receives and amplifies the capacitive signal for further processing. Quadrature cancellation circuitry processes the output of the C2V amplifier to isolate the quadrature signal and generate a signal to control variable capacitors coupled to the C2V amplifier input in a manner that removes the quadrature signal from the C2V amplifier output.

20 Claims, 11 Drawing Sheets

GYROSCOPE QUADRATURE CANCELLATION

BACKGROUND

Numerous items such as smart phones, smart watches, tablets, automobiles, aerial drones, appliances, aircraft, exercise aids, and game controllers may utilize sensors such as microelectromechanical system (MEMS) sensors during their operation. In many applications, various types of motion sensors such as accelerometers and gyroscopes may be analyzed independently or together in order to determine varied information for particular applications. For example, gyroscopes and accelerometers may be used in gaming applications (e.g., smart phones or game controllers) to capture complex movements by a user, drones and other aircraft may determine orientation based on gyroscope measurements (e.g., roll, pitch, and yaw), and vehicles may utilize measurements for determining direction (e.g., for dead reckoning) and safety (e.g., to recognizing skid or roll-over conditions).

As MEMS sensors are integrated into an increasing number and type of devices having a variety of applications and form factors, there are numerous constraints on MEMS sensor design and to design of systems including multiple MEMS sensors. In some applications, multiple MEMS sensors (e.g., corresponding to multiple measurement axes) may share certain processing components, such as portions of a sense path and analog and digital processing circuitry. There may be substantial constraints on the physical size and/or power consumption of components that may be utilized with MEMS sensors.

SUMMARY

In an embodiment of the present disclosure, a method for cancelling a quadrature component of a sensed signal of a MEMS gyroscope comprises receiving, at an input of a capacitance-to-voltage (C2V) amplifier, the sensed signal, wherein the sensed signal corresponds to a movement of one or more components of a MEMS structure, outputting, from the C2V amplifier, a C2V output signal, and extracting, from the C2V output signal, a quadrature portion of the C2V output signal. The method further comprises integrating the quadrature portion of the C2V output signal, digitizing the integrated quadrature portion, and generating, by digital processing circuitry, a variable capacitor control signal based on the digitized integrated quadrature portion, wherein the variable capacitor control signal is generated to reduce the quadrature portion of the C2V output signal. The method further comprises providing, from the digital processing circuitry to one or more variable quadrature cancellation capacitors, the variable capacitor control signal, wherein the one or more variable quadrature cancellation capacitors are coupled to the C2V amplifier to modify the received sensed signal, and wherein the quadrature component of the sensed signal is cancelled based on the capacitances of the one or more variable quadrature cancellation capacitors.

In an embodiment of the present disclosure, a MEMS gyroscope comprises a MEMS structure, wherein a sensed capacitive signal associated with the MEMS structure changes based on a sensed angular velocity, and a capacitance-to-voltage (C2V) amplifier, comprising an input coupled to the MEMS structure to receive the sensed capacitive signal. The MEMS gyroscope further comprises a demodulator coupled to an output of the C2V amplifier, wherein the demodulator is configured to demodulate a portion of the output of the C2V amplifier associated with a quadrature portion of the sensed signal, and an integrator coupled to the demodulator to integrate an output signal of the demodulator. The MEMS gyroscope further comprises an analog-to-digital converter (ADC) coupled to the demodulator to digitize an output of the integrator, and digital processing circuitry coupled to an output of the ADC, wherein the digital processing circuitry is configured to generate a variable capacitor control signal based on the output of the ADC, wherein the variable capacitor control signal is generated to reduce the quadrature portion. The MEMS gyroscope further comprises at least one variable capacitor coupled to an output of the ADC and the input of the C2V amplifier, wherein the at least one variable capacitor receives the variable capacitor control signal from the digital processing circuitry, and wherein the quadrature portion of the sensed signal is cancelled based on a capacitance of the at least on variable capacitors.

In an embodiment of the present disclosure, processing circuitry of a MEMS gyroscope, comprises a capacitance-to-voltage (C2V) amplifier, comprising an input coupled to an output of a MEMS structure to receive a sensed capacitive signal from the MEMS structure, and a demodulator coupled to an output of the C2V amplifier, wherein the demodulator is configured to demodulate a portion of the output of the C2V amplifier associated with a quadrature portion of the sensed signal. The processing circuitry further comprises an integrator coupled to the demodulator to integrate an output signal of the demodulator, an analog-to-digital converter (ADC) coupled to the demodulator to digitize an output of the integrator, and digital processing circuitry coupled to an output of the ADC, wherein the digital processing circuitry is configured to generate a variable capacitor control signal based on the output of the ADC, wherein the variable capacitor control signal is generated to reduce the quadrature portion. The processing circuitry further comprises at least one variable capacitor coupled to an output of the digital processing circuitry and the input of the C2V amplifier, wherein the at least one variable capacitor receives the variable capacitor control signal from the digital processing circuitry, and wherein the quadrature portion of the sensed signal is cancelled based on a capacitance of the at least on variable capacitors.

BRIEF DESCRIPTION OF DRAWINGS

The above and other features of the present disclosure, its nature, and various advantages will be more apparent upon consideration of the following detailed description, taken in conjunction with the accompanying drawings in which.

DETAILED DESCRIPTION

Figure 1:
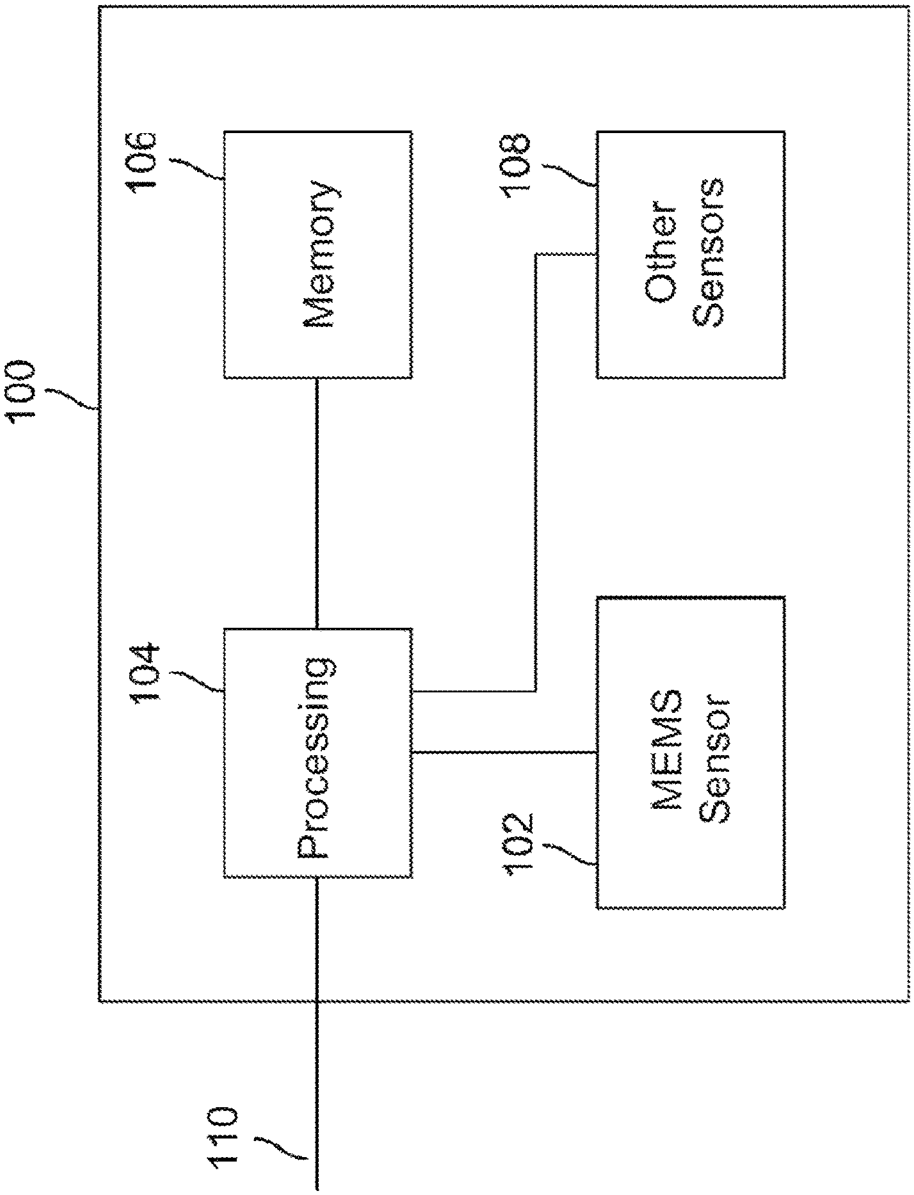
FIG. 1 shows an illustrative MEMS system in accordance with an embodiment of the present disclosure.

A MEMS sensor such as a MEMS gyroscope outputs a capacitance signal that corresponds to the movement of movable MEMS components such as proof masses in response to a force of interest, such as an angular velocity about a particular axis. The received capacitance signal includes a variety of signal components based on the operation of the MEMS, such as the force of interest that is being measured (e.g., angular velocity), a periodic signal that corresponds to the drive frequency of the MEM gyroscope, and undesired signal components or portions such as a quadrature signal. While the intended Coriolis signal strength depends on the speed of rotation, the unintended signals include quadrature, drive harmonics and in-phase offset. Out of the unintended signals quadrature is by far the largest contributor and it can significantly exceed Coriolis signal in strength. The sense path that receives the capacitive signal includes a variety of components such as a C2V converter that provides amplification of the received capacitance signal and additional components such as feedback capacitors for the C2V converter and capacitors and other components used for compensation of undesired signal components.

In some applications, multiple MEMS gyroscope structures may output capacitance signals to a common sense path in a "round-robin" fashion (e.g., via a multiplexer switching gyroscope output signals at a switching frequency), allowing a single sense path to selectively provide processing for multiple MEMS gyroscope capacitive signals. In some instances, a component such as reset switches (e.g., connected in parallel with the C2V converter) perform a function of resetting or otherwise removing a contribution of a previously processed capacitive signal from a capacitive signal that is currently being processed (e.g., with the reset occurring at the switching frequency). In some implementations, this reset may occur when the periodic portion of the capacitance signal associated with the force of interest (e.g., the Coriolis signal) is at or near zero. After a transition from one capacitance signal to the next (e.g., from processing one gyroscope axis output to the next gyroscope axis output), the C2V may nonetheless be sampling the unwanted quadrature signal, which is 90 degrees out of phase with the Coriolis signal.

However the C2V signal is supplied and generated, this output from the C2V converter often includes a DC offset due to quadrature sampling as well as the quadrature signal. Additional circuitry and processing may be implemented to substantially reduce or eliminate contributions of the quadrature signal to the C2V output signal. The output of the C2V converter is processed and analyzed to identify and determine characteristics of the quadrature contribution of the C2V output. A feedback look is implemented wherein a control signal is provided to control circuitry coupled to the C2V input in a manner that reduces or eliminates that quadrature signal portion of the C2V output. In this manner, the feedback loop is continuously operating to dynamically drive and maintain the quadrature signal contribution to the C2V output towards zero. Without the quadrature signal contribution occupying the dynamic range of the C2V, the C2V gain can be better allocated to the signal of interest (e.g., Coriolis signal), resulting in a larger C2V amplifier gain. A larger amplifier gain suppresses analog-to-digital converter (ADC) noise in the signal processing path of the C2V output, resulting in an overall lower noise system.

In an example implementation, the C2V output signal may be coupled to an analog stage including a mixer, an integrator, and an ADC, with the mixer demodulating the quadrature portion of the C2V output signal, the integrator processing the demodulated quadrature portion over time to output an averaged signal that changes with the quadrature signal portion, and the ADC converting the output of the integrator into a digital signal that can be processed by a digital stage that modulates the control signal. An example digital stage applies sigma-delta modulation to modulate the control signal in a manner to drive the quadrature signal portion towards zero, which in turn eliminates or substantially reduces both the quadrature-caused offset and the quadrature signal from the C2V output signal. In an example, the control signal controls a capacitive digital-to-analog (DAC) converter, which may be implemented as variable capacitors that are coupled to the sense path between the MEMS sensor capacitive output and the C2V input. In this manner, the system employs a capacitive DAC modulated by a digitally controlled loop (e.g., a sigma-delta modulator) in order to cancel quadrature dynamically.

FIG. 1 shows an illustrative MEMS system 100 in accordance with an embodiment of the present disclosure. Although particular components are depicted in FIG. 1, it will be understood that other suitable combinations of the MEMS, processing components, memory, and other circuitry may be utilized as necessary for different applications and systems. In accordance with the present disclosure, the MEMS system may include a MEMS gyroscope 102 as well as additional sensors 108. Although the present disclosure will be described in the context of capacitive signals received from MEMS gyroscopes, it will be understood that the quadrature cancellation circuitry and processing described in the present disclosure may be utilized with other capacitive MEMS sensors or gyroscope sensing methodologies.

Processing circuitry 104 may include one or more components providing processing based on the requirements of the MEMS system 100. In some embodiments, processing circuitry 104 may include hardware control logic that may be integrated within a chip of a sensor (e.g., on a base substrate of a MEMS gyroscope 102 or other sensors 108, or on an adjacent portion of a chip to the MEMS gyroscope 102 or other sensors 108) to control the operation of the MEMS gyroscope 102 or other sensors 108 and perform aspects of processing for the MEMS gyroscope 102 or the other sensors 108. In some embodiments, the MEMS gyroscope 102 and other sensors 108 may include one or more registers that allow aspects of the operation of hardware control logic to be modified (e.g., by modifying a value of a register). In some embodiments, processing circuitry 104 may also include a processor such as a microprocessor that executes software instructions, e.g., that are stored in memory 106. The microprocessor may control the operation of the MEMS gyroscope 102 by interacting with the hardware control logic and processing signals received from MEMS gyroscope 102. The microprocessor may interact with other sensors 108 in a similar manner. In some embodiments, some or all of the functions of the processing circuitry 104, and in some embodiments, of memory 106, may be implemented on an application specific integrated circuit ("ASIC") and/or a field programmable gate array ("FPGA").

Although in some embodiments (not depicted in FIG. 1), the MEMS gyroscope 102 or other sensors 108 may communicate directly with external circuitry (e.g., via a serial bus or direct connection to sensor outputs and control inputs), in an embodiment the processing circuitry 104 may process data received from the MEMS gyroscope 102 and other sensors 108 and communicate with external components via a communication interface 110 (e.g., a serial peripheral interface (SPI) or I2C bus, in automotive applications a controller area network (CAN) or Local Interconnect Network (LIN) bus, or in other applications a suitably wired or wireless communications interface as is known in the art). The processing circuitry 104 may convert signals received from the MEMS gyroscope 102 and other sensors 108 into appropriate measurement units (e.g., based on settings provided by other computing units communicating over the communication interface 110) and perform more complex processing to determine measurements such as orientation or Euler angles, and in some embodiments, to determine from sensor data whether a particular activity (e.g., walking, running, braking, skidding, rolling, etc.) is taking place. In some embodiments, some or all of the conversions or calculations may take place on the hardware control logic or other on-chip processing of the MEMS gyroscope 102 or other sensors 108.

In some embodiments, certain types of information may be determined based on data from multiple MEMS gyroscopes 102 and other sensors 108 in a process that may be referred to as sensor fusion. By combining information from a variety of sensors it may be possible to accurately determine information that is useful in a variety of applications, such as image stabilization, navigation systems, automotive controls and safety, dead reckoning, remote control and gaming devices, activity sensors, 3-dimensional cameras, industrial automation, and numerous other applications.

In embodiments of the present disclosure, the MEMS sensor such as a MEMS gyroscope includes components that respond to a force of interest such as an angular velocity about an axis of interest by moving in a manner (e.g., in response to a Coriolis force generated by the coupling of a drive motion the MEMS gyroscope to the angular velocity about an axis perpendicular to the drive motion) that changes a capacitance between adjacent components. Although differential sensing is not required in the context of the present disclosure, the MEMS components may be configured such that differential outputs are generated in response to the force of interest, for example, based on respective capacitors of a MEMS sensor changing in capacitance in an equal and opposite manner. In addition to including a signal portion corresponding to the Coriolis force (e.g., a Coriolis signal), the output capacitance signal from the MEMS structure includes other signals and noise, with the most prominent of such signals portions typically being a quadrature portion (e.g., a quadrature signal) that is 90 degrees out of phase with the Coriolis signal at the same frequency (e.g., corresponding to the drive frequency of the MEMS gyroscope). The capacitance signal outputs from the MEMS sensor are provided to an amplifier such as a C2V converter, which in the context of round-robin sensing (e.g., multiple sensor outputs being output to common processing circuitry over time) may be reset such as when the capacitance signal outputs are changed to a new MEMS sensor output or periodically during measurement of a MEMS sensor output (e.g., at a full period of the Coriolis signal). The output of the C2V is provided to quadrature processing circuitry, which analyzes a quadrature portion of the C2V output signal, which in turn corresponds to an undesired (e.g., non-Coriolis) portion of the C2V output, and is an artifact of the MEMS sensor configuration (e.g., including quadrature signals and carrier signals) and other processing such as timing of C2V resets.

The quadrature processing circuitry includes components such as a mixer, an integrator, an ADC (e.g., a successive-approximation-register or SAR ADC) and digital processing (e.g., a sigma-delta modulator). The mixer receives a demodulation input signal that is in phase with the quadrature signal at the quadrature signal frequency, and thus brings the quadrature signal to its baseband. The integrator integrates (e.g., averages) the output of the C2V converter over time, resulting in an output that approximates the amplitude of the presently sensed quadrature signal. The ADC digitizes the output of the integrator and provides the digitized integrator output to the digital processing. The digital processing (e.g., sigma-delta modulator) evaluates the digitized integrator output, which is representative of the quadrature portion of the signal, and generates control signals for digitally controlled variable capacitors (e.g., a selectable capacitor bank) connected at the input to the C2V. These control signals modify the variable capacitors in a manner that reduces the quadrature that is output by the C2V, while not modifying the underlying sensor output signal (e.g., a sensed signal such as a Coriolis signal output from a gyroscope, modulated by a drive/carrier frequency). The digital processing continues to dynamically modify the values of the variable capacitors to maintain the quadrature at a negligible value. This allows the gain of the C2V to be allocated to the underlying sensed (e.g., Coriolis) signal.

Figure 2:
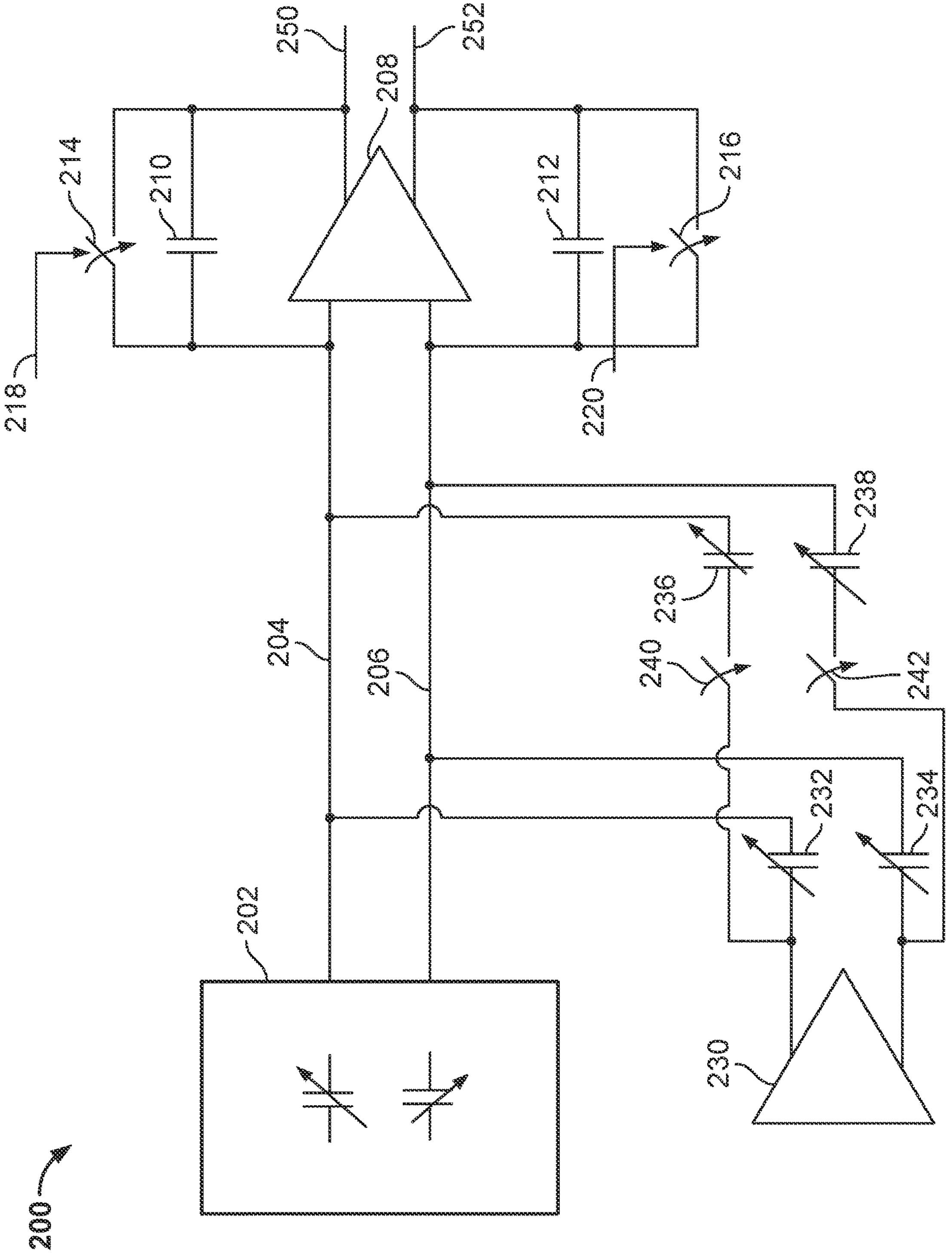
FIG. 2 depicts a circuit diagram of exemplary MEMS sensor in accordance with an embodiment of the present disclosure.

FIG. 2 depicts a circuit diagram of exemplary MEMS sensor in accordance with an embodiment of the present disclosure. Although FIG. 2 will be described in the context of a particular application and system components, it will be understood that the present disclosure may be utilized with a variety of systems and sensors, such as different types of MEMS sensor or capacitive sensing devices. Although particular components are depicted and described in FIG. 2, it will be understood that components may be added, removed, substituted, or modified in accordance with the present disclosure. In the example depicted in FIG. 2, a MEMS sensor includes a MEMS structure 202, a sense path including first sense path signal line 204 and second sense path signal line 206, a C2V amplifier 208, feedback capacitors 210 and 212, reset switches 214 and 216, reset control lines 218 and 216, first C2V output 250, second C2V output 252, drive circuitry 230, first (feed through or "FT") capacitor 232, second FT capacitor 234, first (sampled offset or "SOC") capacitor 236, second SOC capacitor 238, first SOC switch 240, and second SOC switch 242.

In an exemplary embodiment where the MEMS sensor 200 is a MEMS gyroscope, the gyroscope sense path typically consists of a C2V amplifier 208 and an analog-to-digital converter ("ADC"—not depicted in FIG. 2) that follows it. The C2V amplifier 208 is a capacitance sensing circuit, that converts the rotation-related charge stored on MEMS capacitors formed by MEMS structure 202 to an output voltage by pushing this charge from MEMS capacitors (not depicted) to feedback capacitors (e.g., feedback capacitors 210 and 212) of the C2V amplifier 208. The C2V amplifier 208 output common mode 250/252 is set by an output common mode amplifier (not depicted), while the input common mode may be set either by a very large feedback resistor (e.g., a Gigaohm FET, not depicted) or a periodic reset signal (e.g., 218 and 220) that shorts the output of the C2V to its input (e.g., via switches 214 and 216).

In some instances, the signals output to the sense path (e.g., first sense path signal line 204 and second sense path signal line 206) may be provided in a round robin fashion from multiple MEMS structures 202, for example, by time multiplexing (not depicted in FIG. 2) the outputs of multiple MEMS structures 202. An example of round robin sensing is described in U.S. patent application Ser. No. 17/680,637, filed on Feb. 25, 2022, and entitled "Round Robin Sensor Device for Processing Sensor Data," which is incorporated by reference herein in its entirety. With round robin operations only a reset method of applying output common mode to input is feasible due to the short time that the reset signal (e.g., 218 and 220) is present. The timing of the reset signal 218/220 is typically aligned with the zero crossing of the Coriolis signal sinusoid that is output by the MEM structure 202.

When the reset switch is opened, the sampled MEMS Coriolis signal (e.g., including a signal at a drive frequency of the system, with a signal due to angular velocity modifying the amplitude of the Coriolis signal) provided as an input to C2V amplifier 208 via the sense path (first sense path signal line 204 and second sense path signal line 206) is transferred to C2V feedback capacitors 210 and 212 and shows up as a sampled offset at C2V output 250/252. Since the MEMS Coriolis signal is nearly zero at that time, very little of the MEMS signal gets sampled during the release of the reset signal and very little of C2V output range is occupied by such offset.

Figure 3:
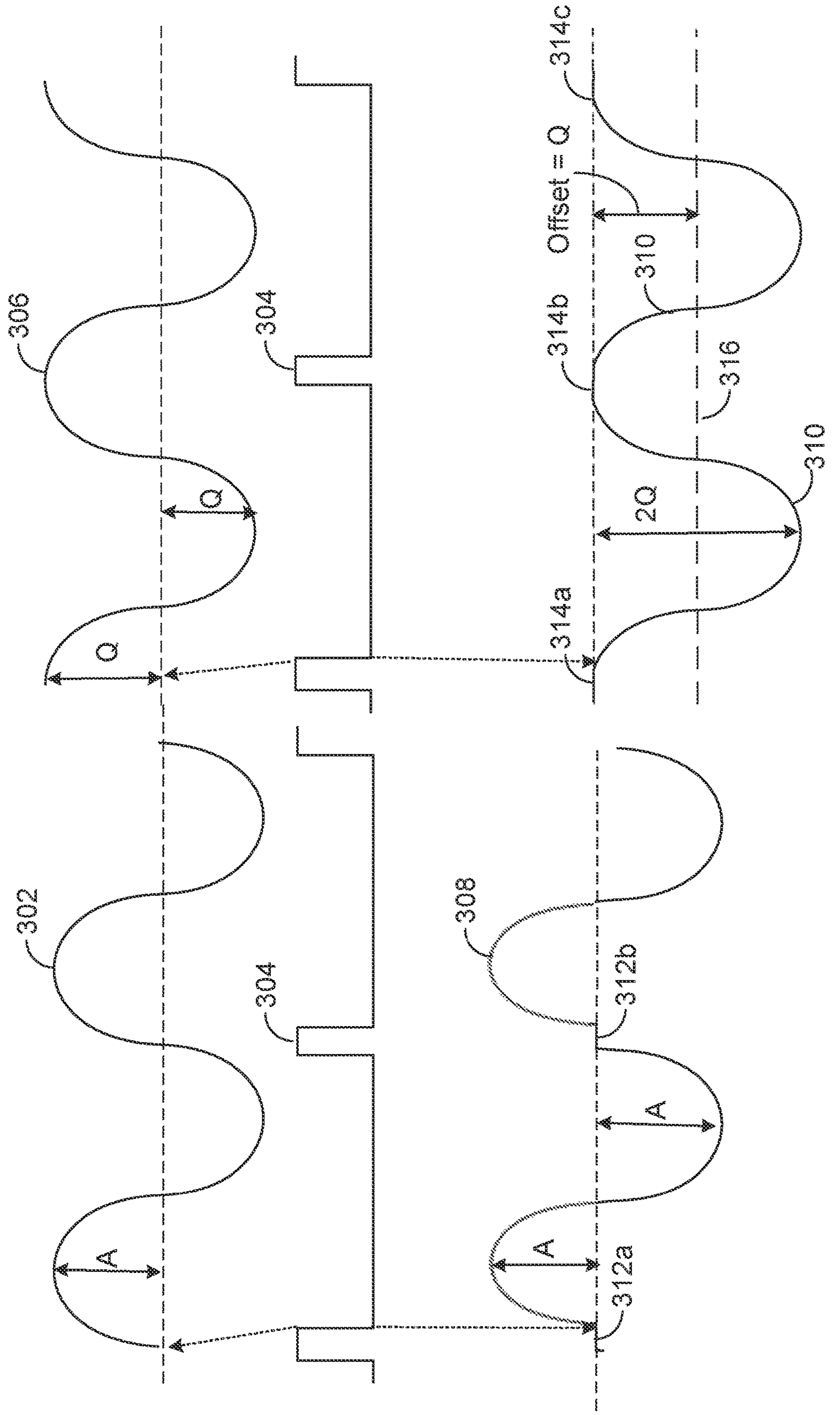
FIG. 3 depicts exemplary signal plots of capacitance-to-voltage (C2V) converter input, reset, and output signals for a MEMS sensor in accordance with an embodiment of the present disclosure.

Other signals such as quadrature and harmonics are present with the Coriolis signal within the sense path signal lines 204/206. As it is 90 degrees out of phase with the Coriolis signal and the reset occurs at a zero-crossing of the Coriolis signal, a quadrature signal sampled at the opening of the reset switches is at its maximum. In some embodiments, the C2V amplifier sampled offset due to quadrature is partially cancelled via statically trimmed SOC capacitors (e.g., SOC capacitors 236 and 238, which are selectively placed in parallel with FT capacitors 232 and 234 between drive circuitry 230 (e.g., applying a DC voltage)) and the sense path signal lines 202/204. The trimming of the SOC capacitors may be performed such as during manufacturing, e.g., in a manner that attempts to match and partially remove a contribution of the unwanted quadrature signal from the C2V amplifier 208 output. However, this trimming is limited in precision and only occurs at one point in time, whereas moderate wear, temperature, stresses applied during assembly with other components, and the like may occur after the MEMS sensor manufacturing, such that the original trimming no longer matches the actual quadrature signal output, resulting in the appearance of an undesired quadrature-based signal (e.g., including the quadrature-based offset and quadrature signal) at the output of C2V amplifier 208. This quadrature output signal, in turn, forces the amplifier 208 to be trimmed with a reduced gain by increasing capacitances 210 and 212 since the quadrature signal component occupies a significant portion of the C2V amplifier 208 output. This reduces amplification of the signal of interest, such as Coriolis signal, which reduces signal-to-noise ratio of such signal when noise from circuit components such as an integrator or an ADC, typically connected to amplifier 208 output, are taken into account FIG. 3 depicts exemplary signal plots of capacitance-to-voltage (C2V) converter input, reset, and output signals for MEMS sensor in accordance with an embodiment of the present disclosure. Although particular plots for particular types of signals are depicted in FIG. 3, it will be understood that other signal sources (e.g., instead of or in addition to Coriolis signal 302 and uncancelled quadrature signal 306), control signals (e.g., instead of or in addition to reset signal 304) and output signals (e.g., instead of or in addition to Coriolis output signal 308 and quadrature output signal 310, having different characteristics based on different C2V amplifier configurations or different sense circuitry) may exhibit similar characteristics that may be processed and compensated in accordance with the present disclosure. In the embodiment of FIG. 3, a Coriolis signal 302, reset signal 304, quadrature signal 306, and Coriolis output signal 308, and quadrature output signal 310 are described and depicted on a common timescale.

A Coriolis signal 302 may have a frequency in accordance with a drive frequency of a MEMS gyroscope and may include amplitude changes based on an angular velocity that causes a Coriolis force to occur, such as to a proof mass of the MEMS gyroscope that forms capacitors with an adjacent sense electrode. An output of a MEMS gyroscope may also include a quadrature signal 306 at the drive frequency of the MEMS system but 90 degrees out of phase with Coriolis signal 302. Although the Coriolis signal 302 and quadrature signal 306 are provided as a single combined output from the MEMS sensor to the C2V amplifier, the signal portions are depicted separately in FIG. 3 for ease of illustration, in order to depict the effect of a reset timing on an output C2V signal. As described with respect to FIG. 2, even when cancellation is performed on the quadrature signal, a significant quadrature signal may remain. In some instances, no quadrature cancellation may be performed and the entirety of the quadrature output of the MEMS gyroscope may be represented as quadrature signal 306.

As depicted in FIG. 3, a reset pulse is aligned with certain zero-crossings of the Coriolis signal 302, for example, based on the known frequency and phase of a provided drive signal to drive the MEMS gyroscope. As described herein, a reset signal 304 temporarily resets the sense circuitry such as by temporarily creating a short between the input and output of a C2V amplifier. As depicted at Coriolis output signal 308, during this time that the reset signal 304 is active the amplitude of the Coriolis output signal 308 is zero (e.g., at reset output portions 312*a* and 312*b*). After the reset signal becomes inactive, the contributions of the Coriolis signal 302 to the Coriolis output signal 308 starts from zero at the time of the release of the reset such that the Coriolis offset of the output signal 308 is a periodic signal that generally aligns to the Coriolis signal 302 with an amplitude A until the next reset, resulting in an average value (e.g., DC offset value) for the Coriolis output signal 308 that approximates zero.

Because the quadrature signal 306 is 90 degrees out of phase with the Coriolis signal 302, the reset occurs at a non-zero point of the quadrature signal near the signal maximum or minimum peak (e.g., depending on which zero-crossing of the Coriolis signal corresponds to the reset signal). After an initial zero output 314*a* of the quadrature output signal 310 during the initial reset (and after later resets 314*b* and 314*c*) the quadrature signal decreases from the zero output signal level, resulting in an oscillation about a signal level of −Q (e.g., with Q being the quadrature signal amplitude) below the zero signal level. This results in a DC offset of Q corresponding to the quadrature output signal 310, which in turn has a peak-to-peak amplitude 2Q based on the uncancelled quadrature signal received at the C2V amplifier input. Accordingly, because the output of the C2V due to quadrature (e.g., quadrature signal oscillating about an offset signal due to quadrature) is seen at the output of the C2V amplifier even in the absence of a Coriolis force, a significant portion of the C2V range is consumed by this quadrature output, resulting in saturation if scaling for the Coriolis output is increased significantly.

Figure 4:
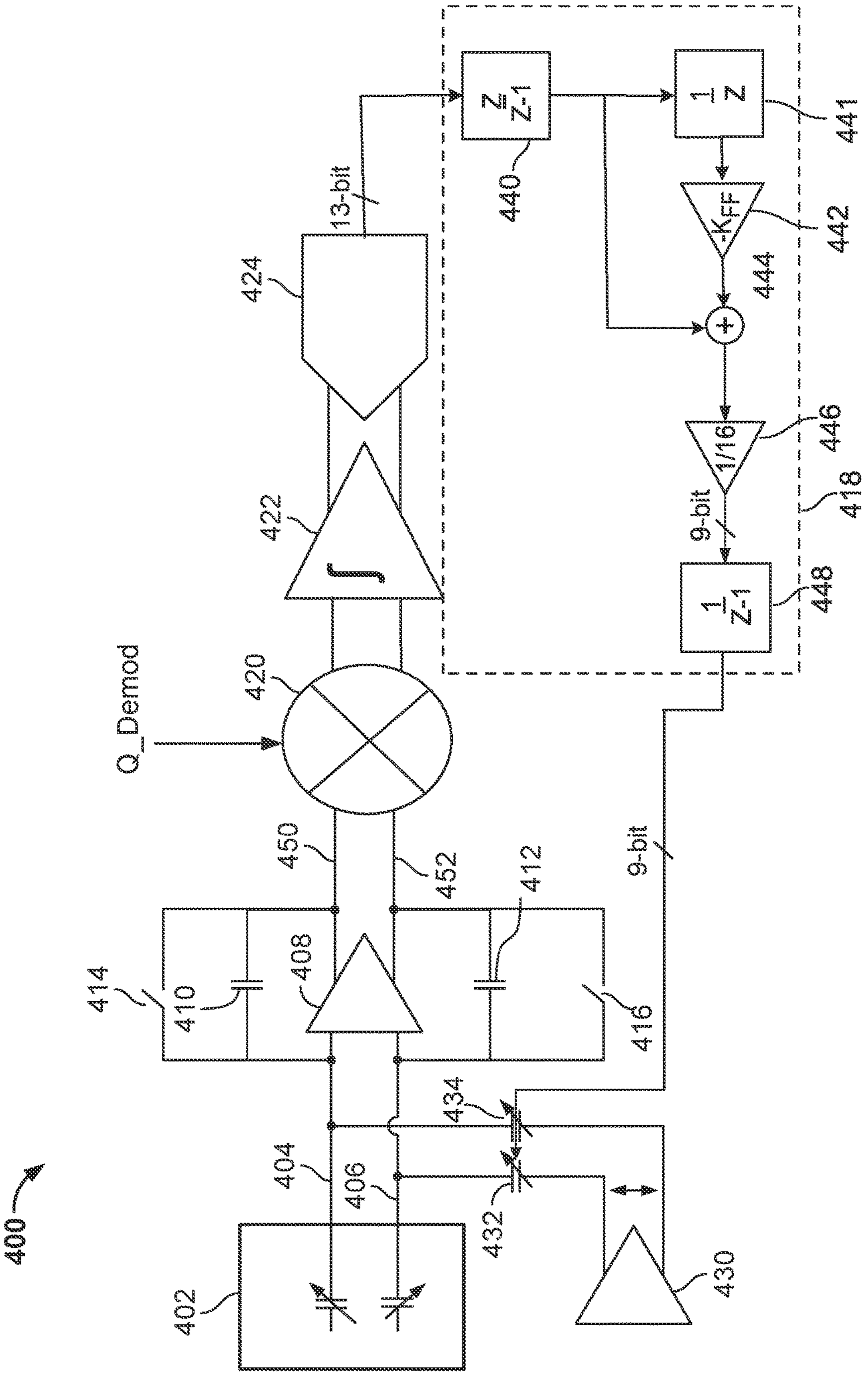
FIG. 4 depicts a circuit diagram of an exemplary MEMS sensor including quadrature cancellation in accordance with an embodiment of the present disclosure.

FIG. 4 depicts a circuit diagram of an exemplary MEMS sensor including quadrature cancellation in accordance with an embodiment of the present disclosure. Although FIG. 4 will be described in the context of a particular application and system components, it will be understood that the present disclosure may be utilized with a variety of sensors, systems, or applications where quadrature cancellation is required. Although particular components are depicted and described in FIG. 4, it will be understood that components may be added, removed, substituted, or modified in accordance with the present disclosure. In the example depicted in FIG. 4, a MEMS sensor 400 includes a MEMS structure 402 and processing circuitry, the processing circuitry including first sense path signal line 404 and second sense path signal line 406, a C2V amplifier 408, feedback capacitors 410 and 412, reset switches 414 and 416 (reset control lines are not depicted in FIG. 4), first C2V output 450, second C2V output 452, drive circuitry 430, variable capacitor 432, variable capacitor 434, mixer 420, integrator 422, ADC 424 (e.g., a 13-bit SAR ADC), and digital stage 418. Although the digital stage may be implemented in a variety of manners including sigma-delta and non-sigma delta methodologies, in an embodiment the digital stage 418 may comprise a second-order sigma-delta modulator. Although a second-order delta-sigma modulator may be implemented in a variety of manners, in an embodiment the sigma-delta modulator may include first filter 440, second filter 441, first gain element 442, adder 444, second gain element 446, and third filter 448.

In an exemplary embodiment where the MEMS sensor 400 is a MEMS gyroscope, the gyroscope sense path typically consists of a C2V amplifier 408 and an analog-to-digital converter (e.g., a second ADC connected to the C2V amplifier 408 output, not depicted in FIG. 4) that follows it. As described herein, quadrature cancellation circuitry such as the circuitry depicted in FIG. 4 (e.g., including an analog stage including mixer 420, integrator 422 and ADC 424, a digital stage 418, variable capacitors 432 and 434, and drive circuitry 430) dynamically removes the quadrature portion from the C2V amplifier 408 output (e.g., the signal seen at C2V outputs 450 and 452). More gain can therefore be applied at C2V amplifier 408, providing additional amplification of a Coriolis signal that is provided (e.g., via signal paths from C2V outputs 450 and 452) to another ADC (e.g., another SAR ADC without a mixer and integrator connected between the C2V amplifier 408 and SAR ADC) such that the ADC has additional bits (e.g., corresponding to better resolution) available to process and digitize the Coriolis signal. In another embodiment, the separate Coriolis ADC can consist of a separate integrator, but the SAR 422 can be shared between quadrature correction and Coriolis processing operations.

Referring to FIG. 4, the C2V amplifier 408 is a capacitance sensing circuit that converts the rotation-related charge stored on MEMS capacitors formed by MEMS structure 402 to an output voltage by pushing this charge from MEMS capacitors (not depicted) to feedback capacitors (e.g., feedback capacitors 410 and 412) of the C2V amplifier 408. The C2V amplifier 408 output common mode 450/452 is set by a periodic reset (e.g., at each period of the Coriolis signal, timed to begin at zero-crossing) that shorts the output of the C2V to its input (e.g., via switches 414 and 416).

In some instances, the signals output to the sense path (e.g., first sense path signal line 404 and second sense path signal line 406) may be provided in a round robin fashion from multiple MEMS structures 402, for example, by time multiplexing (not depicted in FIG. 4) the outputs of multiple MEMS structures 402. With round robin operations only a reset method of applying output common mode to input is feasible due to the short time that the reset signal is present. The timing of the reset signal and closing of switches 414 and 416 is typically aligned with the zero crossing of the Coriolis signal sinusoid that is output by the MEM structure 402.

When the reset switch is opened, the sampled MEMS Coriolis signal (e.g., including a signal at a drive frequency of the system, with a signal due to angular velocity modifying the amplitude of the Coriolis signal) is provided as an input to C2V amplifier 408 via the sense path (first sense path signal line 404 and second sense path signal line 406) is transferred to C2V feedback capacitors 410 and 412 and shows up as a sampled offset due to quadrature at C2V output 450/452. Since the MEMS Coriolis signal is nearly zero at that time, very little of the MEMS signal gets sampled during the release of the reset signal and very little of C2V output range is occupied by such offset. As described herein, the quadrature circuitry attempts to drive the remaining quadrature portion (e.g., based in part on remaining quadrature signal sampled at the end of the reset) towards zero, substantially removing all of the quadrature signal from the C2V output.

The C2V output signal is provided to mixer 420, which also receives as an input a quadrature demodulation signal, for example, having a frequency and phase that correspond to the frequency and phase of the quadrature signal, which in turn is the same frequency as the Coriolis signal (e.g., modulated at the drive frequency) and 90 degrees out of phase from the Coriolis signal. Because of this relationship to the Coriolis signal, in some embodiments the quadrature demodulation signal may be generated based on a Coriolis demodulation signal used elsewhere within the processing circuitry to demodulate the quadrature signal (e.g., bring the portion of the quadrature signal due to quadrature force to baseband by removing the drive/carrier signal at another mixer). The phase of the Coriolis and/or the quadrature signal may be monitored and updated in some embodiments, for example, to monitor for phase changes that occur during packaging, assembly, standard wear over time, temperature, and the like. Based on the quadrature demodulation signal mixer 420 demodulates the output signal, removing the carrier signal at the drive frequency and bringing the signal due to quadrature to baseband.

The outputs from mixer 420 are provided to integrator 422, which integrates the output signal to output a signal representative of the quadrature. The integrator may average the incoming signal over a gyroscope drive period with a reset of the integrator after each drive period. Averaging over the drive period and resetting nulls out gyroscope drive related tones, since an average of a sinusoid of the period of the sinusoid is zero. The resulting output thus generally corresponds to an average of the signal representative of the quadrature at the C2V output. The integrated signal is output from integrator 422 to ADC 424 (e.g., a SAR DAC), which converts the integrated signal corresponding to the quadrature into a digital signal (e.g., a 13-bit digital signal) for further processing by digital stage 418.

In an embodiment, the digital stage 418 is implemented as a second-order Sigma-Delta modulator that drives the variable capacitor 432/434 values in the direction needed to minimize ADC output, which represents digitized C2V output quadrature. The residual or uncancelled quadrature error (quantization noise) is spread over higher frequency spectrum, with any limit cycles eliminated by built in PRBS (pseudo random binary sequence) generator (not depicted), that injects random noise into digital ADC 424 output. In some embodiments, the random sequence is injected at the ADC 424. This results in zero C2V offset. Although particular filters, gain values, and combinations thereof are depicted as implementing the functionality of digital stage 418, a variety of filters, gain values, combinations thereof, and order of processing operations may be modified in certain embodiments in accordance with the present disclosure. For example, the order of the sigma-delta modulator can be increased or decreased and the update rate of the variable capacitors can increase or decrease. Appropriate gain and filter values, and digital processing operations, may be dependent upon the components of the particular processing circuitry of the MEMS sensor, such as the gain and configuration of the C2V amplifier 408 and related components (e.g., capacitors 410 and 412), the drive frequency of the MEMS structure 402, the number and resolution of available capacitance values for variable capacitors 432 and 434, and other related factors.

Within the exemplary digital stage 418 depicted in FIG. 4, the digital output (e.g., a 13-bit digital representation of the C2V quadrature output) is provided in parallel to first filter 440, which in an embodiment is a delayed integrator with a complex transfer function of z/(z−1). The output of the first filter 440 is provided to adder 444 and to second filter 441, which is in a signal path with first gain element 442 and adder 444. In an embodiment, second filter 441 symbolizes a unit delay and has a complex transfer function of 1/z. The path of gain element 442 having a gain-$K_{FF}$ is used to stabilize the system as described herein, for example, by changing the pole location of the overall transfer function of digital 418 to eliminate the any resonance peaks.

The outputs of first filter 440 and first gain element 442 are combined at adder 444, after which they are provided to second gain element 446, which applies a gain to scale the output appropriately to control the capacitors, which in the embodiment of FIG. 4, is a 1/16 gain that removes four bits of resolution from the digital signal being processed (e.g., resulting in 9 bits of resolution). The output of second gain element 446 is provided to third filter 448, which in the embodiment of FIG. 4, is an integrator having a complex transfer function 1/(z−1).

Figure 5:
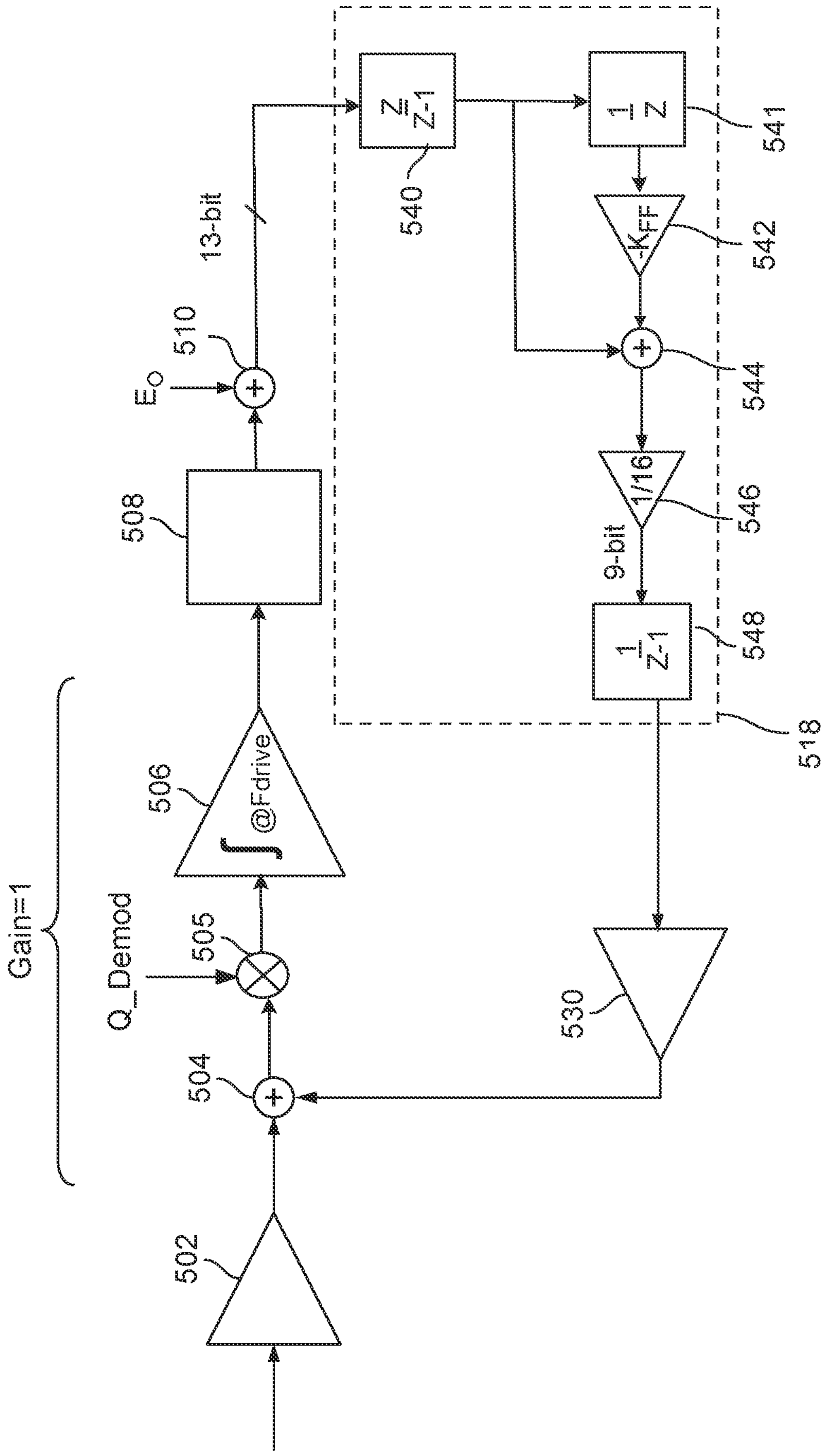
FIG. 5 depicts an exemplary symbolic representation of an exemplary MEMS sensor including quadrature cancellation in accordance with an embodiment of the present disclosure.

A digital control signal (e.g., a 9-bit control signal is output from digital stage 418 to variable capacitors 432 and 434. In an embodiment, each of the variable capacitors 432 and 434 may include an array of capacitors that are selectively switched into a circuit, resulting in combined capacitances that span a wide range of capacitances based on which capacitors are selected and how they are connected to other capacitors within the array of capacitors. The variable capacitors 432 and 434 are responsive to the digital input provided by the control signal output from digital stage 418. When driven by drive circuit 430 (e.g., a drive amplifier that translates capacitive change in the MEMS drive electrodes to an output voltage, resulting in a signal such as a sinusoid at the MEMS drive frequency and having a programmable amplitude), the variable capacitors 432 and 434 with values that are appropriately selected by digital stage 418, provide a complex signal having appropriate characteristics to filter and effectively remove the quadrature signal at the C2V amplifier, removing both the quadrature signal and the offset quadrature signal from the C2V output. In some embodiments, aspects of the drive signal (e.g., amplitude, frequency, phase) provided by drive circuitry 430 may also be modified based on control signals generated by digital stage 418. FIG. 5 depicts an exemplary symbolic representation of an exemplary MEMS sensor including quadrature cancellation in accordance with an embodiment of the present disclosure. Although FIG. 5 will be described in the context of a particular application and system components, it will be understood that the present disclosure may be utilized with a variety of sensor types, capacitive sensing systems, processing circuitry configurations, and digital stage operations. In the exemplary embodiment, each element has a gain contribution to the system. Quantifying and balancing these gains allow the modeling and selection of components and parameters, such as component types, component value, applied gain of components, and digital processing parameters.

In the embodiment of FIG. 5, the symbolic representations generally correspond to components or combinations of components of FIG. 4. Gain element 502 generally combines the calculated gain of the MEMS structure 402, C2V 408, and associated components (e.g., feedback capacitors 410 and 412), and may be dependent on changes to the input signal from the MEMS structure 402, which should generally change with an applied angular velocity (e.g., in degrees per second). Adder 504 represents the combining of the contribution of the quadrature compensation circuit, for example, based on an output of the gain element 530, which has a gain based on the potential values of the variable capacitors 432 and 434 and the characteristics of the drive signal provided by drive circuitry 430, as scaled and modified by the output of the digital stage 518 (e.g., corresponding to digital stage 418).

The adder 504 outputs the combined signal from gain elements 502 and 530 to mixer 505, which corresponds to mixer 420 in FIG. 4, and from there, to integrator 506, which corresponds to integrator 422 in FIG. 4. The adder 504, mixer 505, and integrator 506 perform operations of combining, demodulating and averaging signals, but do not apply any additional gain, and thus have a combined gain of 1 as depicted in FIG. 5. Quantization element 508 and adder 510 correspond to ADC 424, and correspond to a quantization gain (e.g., 4096/1V for a 13 bit SAR ADC) applied at quantization element 508 and the addition of added noise $E_0$ (e.g., a pseudo random binary sequence generator), that injects random noise into digital ADC output as symbolized by adder 510. The output from adder 510 (e.g., corresponding to the digitized quadrature with injected random noise) is provided to digital stage 518, which corresponds to and has digital processing steps corresponding to digital stage 418.

Figure 6:
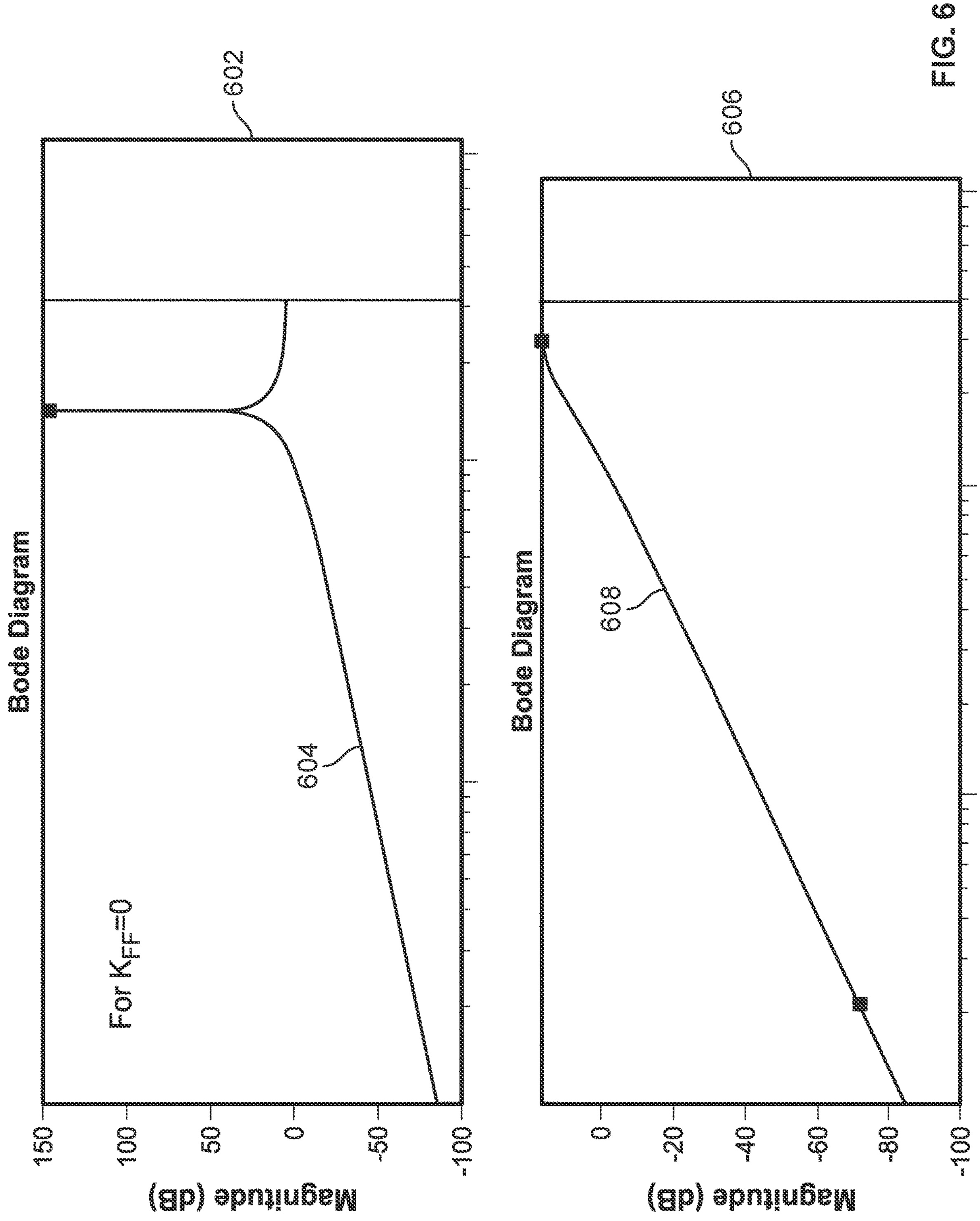
FIG. 6 depicts exemplary Bode diagrams of an output response to quadrature cancellation in a MEMS sensor in accordance with an embodiment of the present disclosure.

FIG. 6 depicts exemplary Bode diagrams of an output response to quadrature cancellation in a MEMS sensor in accordance with an embodiment of the present disclosure. Although FIG. 6 will be described in the context of a particular application and system components, it will be understood that diagrams such as those presented in FIG. 6 will be dependent on the particular configuration and components utilized for capacitive sensing and quadrature cancellation. A first Bode diagram 602 corresponds to an uncompensated system, e.g., with $K_{FF}$ (e.g., corresponding to first digital gain element 442/542 of FIGS. 4-5) set to zero (e.g., removed from the digital stage 418/518 of FIGS. 4-5). As is depicted by first signal transfer function 604, although the signal transfer function is a high-pass, a large resonance peak (e.g., a large response voltage) occurs at a frequency (e.g., corresponding to a frequency of a sensed angular velocity in degrees per second) within a range of interest of the sensor. When an appropriate compensation term with $K_{FF}$ (e.g., corresponding to first digital gain element 442/542 of FIGS. 4-5) is included in the system, a compensated system does not experience a resonance peak within the range of interest, and the signal transfer function is a high-pass.

Figure 7:
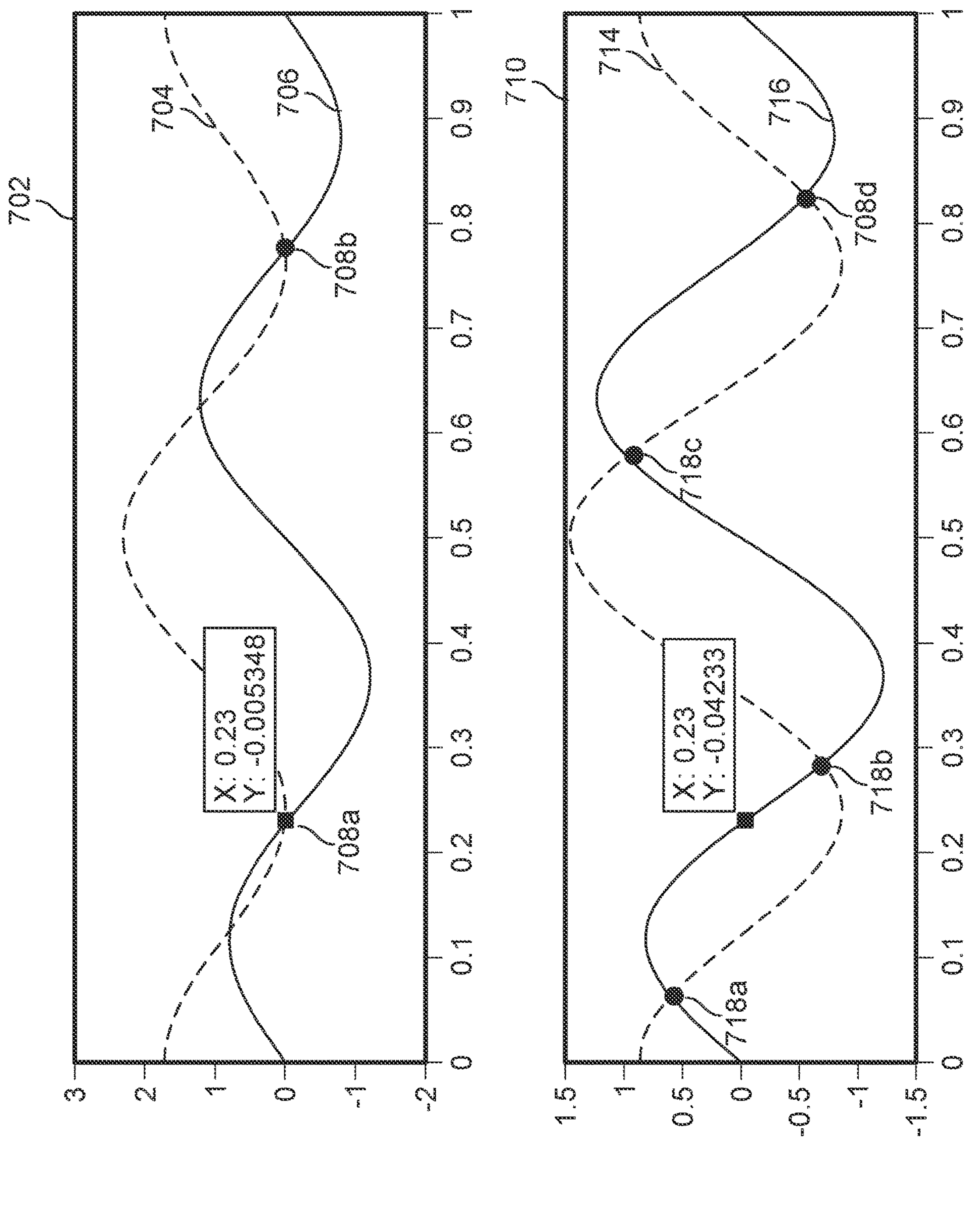
FIG. 7 depicts exemplary plots of real and complex frequency responses of the system corresponding to different gain coefficient values, in accordance with an embodiment of the present disclosure.

FIG. 7 depicts exemplary plots of real and complex frequency responses of the system corresponding to different gain coefficient values, in accordance with an embodiment of the present disclosure. These are depicted and described in the context of the particular system and digital stage depicted in FIGS. 4-5 herein, but it will be understood that the gain coefficient selection described herein applies to other implementations, and can be identified by modeling the system, for example, as described herein.

The system depicted and described can be represented as follows:

$$K_{IN} * DPS_{IN} - V_{OUT} * \frac{Q}{16} * \frac{K_{FB}}{(Z-1)^2} * (Z - K_{FF}) = V_{OUT} \tag{1}$$

where:

$K_{IN}$=gain of MEMS sensor and C2V (e.g., as corresponding to 502)

$DPS_{IN}$=angular velocity sensed by MEMS sensor (e.g., at 502)

$V_{OUT}$=output voltage from integrator 506

Q=quantization gain of ADC 508

$K_{FB}$=feedback path gain 530

$K_{FF}$=gain of stabilization gain element 542

Shifting the $V_{OUT}$ terms to the same side of the equation and simplifying terms results in the following:

$$K_{IN} * DPS_{IN} = V_{OUT}\left(1 + Q/16 * \frac{K_{FB} * (Z - K_{FF})}{(Z-1)^2}\right) \tag{2}$$

The equation can be further simplified with the complex terms as follows:

$$K_{IN} * DPS_{IN} = V_{OUT}\left(\frac{Z^2 - 2Z + 1 + \frac{K_{FB}Q}{16} * Z - K_{FB}\frac{Q}{16}K_{FF}}{(Z-1)^2}\right) \tag{3}$$

-continued $$K_{IN} * DPS_{IN} = V_{OUT}\left(\frac{Z^2 + Z\left(\frac{K_{FB}Q}{16} - 2\right) + 1 - K_{FB}\frac{Q}{16}K_{FF}}{(Z-1)^2}\right) \tag{4}$$

Based on the above, the response of the system ($V_{OUT}$) to a particular sensed angular velocity ($DPS_{IN}$) can be represented as follows:

$$\frac{V_{OUT}}{DPS_{IN}} = K_{IN}\frac{(Z-1)^2}{Z^2 + Z\left(\frac{K_{FB}Q}{16} - 2\right) + 1 - \frac{K_{FB}Q}{16} * K_{FF}} \tag{5}$$

In the above equation (5), the real and complex portions of the denominator depend in part on the values of $K_{FF}$ and $K_{FB}$. Plot 702 illustrates an example where $K_{FF}$ is set to zero, with the amplitude of the real portion 704 and complex portion 706 varying based on the x-axis frequency of angular velocity in units of 2Π*x (rad). As is depicted in plot 702, there are multiple frequencies 708*a* and 708*b* (e.g., at approximately 0.23 and 0.88) where both the real portion 704 and the complex portion 708 are zero or approximately zero simultaneously. As a result, the denominator term of equation (5) above approaches zero, resulting in a resonance peak at these frequencies, for example, as depicted in first signal transfer function 604.

Plot 710 depicts an appropriately selected stabilization gain such as $K_{FF}$=0.5 for the system depicted herein, although it will be understood that different stabilization gains will be selected based on particular sensor characteristics, analog circuitry, and digital processing implementations. As depicted in FIG. 7, real portion 714 and complex portion of 716 only intersect at amplitudes (e.g., 718*a*, 718*b*, and 718*c*) that are significantly greater or less than zero, meaning that the overall denominator of equation (5) does not approach zero at any time, for example, as depicted in second signal transfer function 606.

Figure 8:
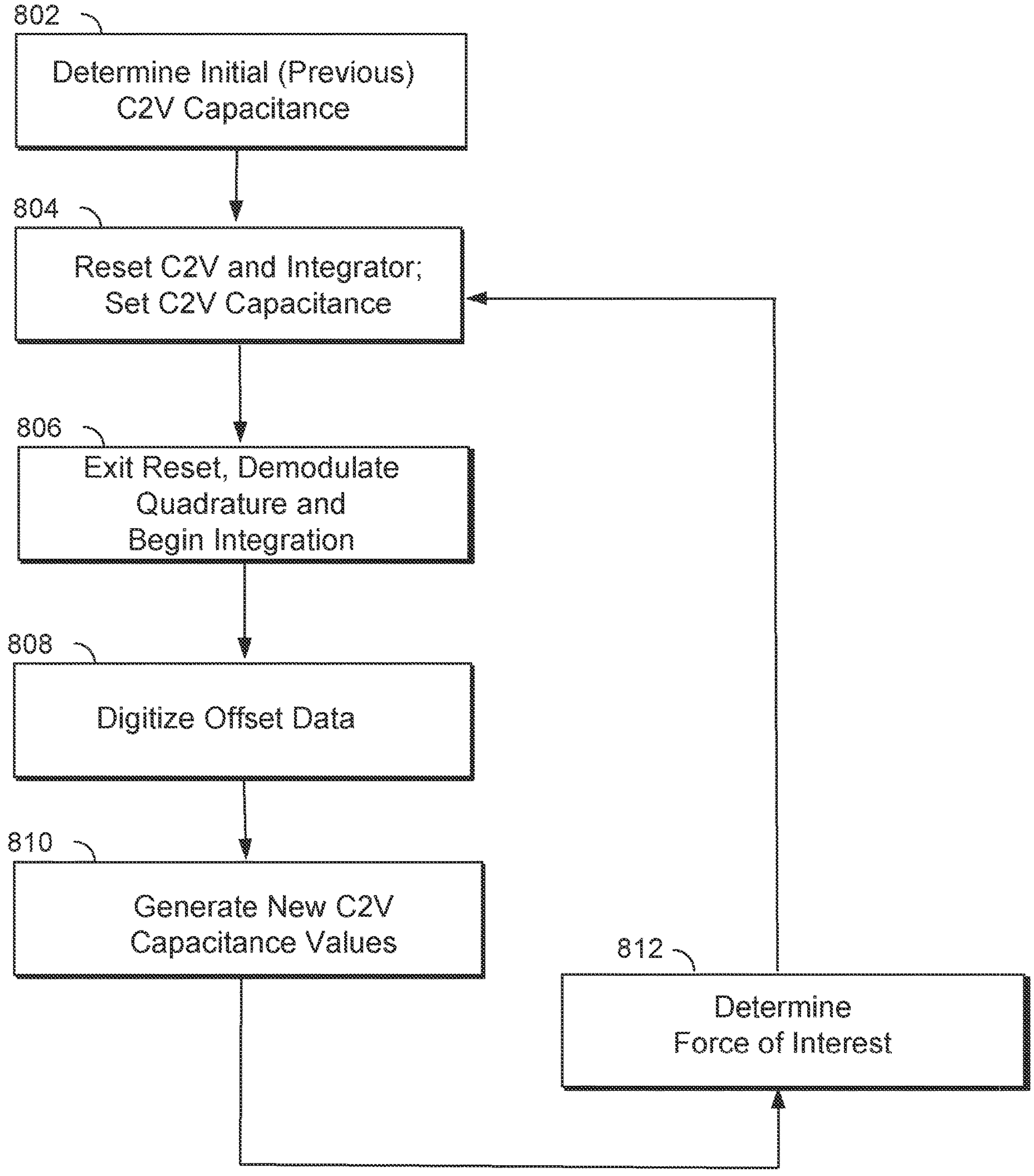
FIG. 8 depicts exemplary steps of quadrature cancellation in a MEMS sensor in accordance with an embodiment of the present disclosure.

FIG. 8 depicts exemplary steps of quadrature cancellation in a MEMS sensor in accordance with an embodiment of the present disclosure. Although particular steps are depicted in a certain order for FIG. 8, steps may be removed, modified, or substituted, and additional steps may be added in certain embodiments, and in some embodiments, the order of certain steps may be modified. Although the steps of FIG. 8 may be described in the context of certain of the implementations discussed herein, it will be understood that these steps may be applied to all of the implementations disclosed in the present disclosure.

Processing starts at step 802, where an initial C2V capacitance to be applied to the system (e.g., via variable capacitors as described herein) may be determined, for example, by accessing previously determined variable capacitor values from memory for a particular sensor, or in round-robin operation, a particular axis being switched into the sense path. In some instances, variable capacitance values may have previously been set for the sensor or axis as described herein, such that conditions may be similar to the present operating conditions and the initial variable capacitor values may substantially remove the quadrature signal from the C2V output. Once the initial variable capacitor values are determined, processing may continue to step 804.

At step 804 the output of a C2V amplifier is reset and the integrator is also reset. In an example of a round-robin system for processing MEMS sensor outputs, multiple MEMS structures or portions of structures (e.g., a multi-axis sensing MEMS gyroscope) may sense different forces of interest (e.g., a 3-axis gyroscope may include signal outputs corresponding to a sensed angular velocity about each of an x-axis, y-axis, and z-axis). The signals may be processed by shared processing circuitry, for example, by multiplexing the sensed capacitance signals (e.g., time multiplexing) such that each signal is provided to the processing circuitry at appropriate times, and with appropriate sampling periods, to process each of the received signals. In this manner, the area occupied by processing circuitry and overall power consumption of the MEMS sensor may be reduced. Although a reset (e.g., shorting the input of the C2V amplifier to the output of the C2V amplifier) may also be implemented for other purposes (e.g., for generating a common-mode output), in an embodiment of round robin processing the reset may temporarily zero the output of the C2V amplifier and the integrator, for example, at a time when the periodic Coriolis signal is at a zero-crossing. The C2V amplifier and integrator may then be reset periodically during sensing, for example, at each period of the signal being sensed. The reset may persist for an adequate time to zero the output of the C2V amplifier and integrator, after which the reset is removed (e.g., by removing the short between the C2V amplifier input and output). After the reset is removed, processing may continue to step 806.

At step 806, after the reset is removed, the signal corresponding to the force of interest may be received. Although components may be included in the system (e.g., trimming capacitors at a C2V input) to remove signal components that contribute to a C2V quadrature output signal (e.g., by reducing a quadrature portion of the received signal), there may nonetheless be a significant signal component received by the C2V input even when the reset is timed to correspond to a zero-crossing of the signal corresponding to the force of interest (e.g., the Coriolis signal). As an example, in a gyroscope the initial trimming may not be precise, the characteristics of the gyroscope may drift over time, the characteristics of the gyroscope may change after trimming (e.g., due to stress imparted on the MEMS structure when the sensor is assembled with other components of the end product), or the operating environment (e.g., temperature) may impact the gyroscope response. When the initial received signal has a significant signal component (e.g., a quadrature signal) at the time of the release of the reset, that signal component will appear at the C2V output, with the signal of interest riding on this quadrature output signal. The quadrature output signal may occupy a substantial portion of the output range of the C2V amplifier, limiting the ability to apply additional gain to the signal of interest to increase sensing resolution. The output of the C2V amplifier is provided to a mixer having an input signal at the frequency and phase of the quadrature signal, and the corresponding baseband quadrature signal is then integrated. Integrating the quadrature signal averages the C2V output signal at an integer multiple of gyroscope oscillation period (e.g., one), reducing the contribution of the force of interest (e.g., a sensed angular velocity with a carrier frequency corresponding to the drive frequency), resulting in a signal that corresponds to the quadrature portion of the C2V output signal. When the C2V signal is initially output after a reset, the amplitude of the quadrature portion of the C2V output signal may be significant compared to the amplitude of the signal corresponding to the force of interest (e.g., Coriolis signal). As described herein and in the following steps, the analog and digital stages of the present disclosure modify values of variable capacitors located at an input to the C2V amplifier in a manner that reduces the contribution of the quadrature to the C2V output signal. Accordingly, the output portion of the signal that is output by the integrator is driven towards zero in a short period of time between resets (e.g., repeated loops of the steps of FIG. 8) and the output of the integrator is similarly driven towards zero. Once the C2V output signal is demodulated and integrated, processing may continue to step 808.

At step 808, the output of the integrator from step 806 may be digitized to prepare the output for processing by the digital stage. The integrator output is digitized with adequate precision (e.g., bits) for the digital stage to provide appropriate processing, for example, to avoid output swings caused by rough digital transitions. Further, because the C2V output signal has been integrated, the digital stage will be able to process the quadrature portion of the C2V output signal without needing to compensate for signal changes due to periodic portions of the C2V output signal (e.g., Coriolis signal, etc.). In an exemplary embodiment the integrated C2V output signal may be digitized by an ADC such as a SAR ADC, and an exemplary resolution of the ADC may be 13 bits. In some instances, the ADC or subsequent circuitry may inject random noise into the digital output, for example, with a built in PRBS (pseudo random binary sequence) generator. The uncancelled quadrature error (quantization noise) is spread over higher frequency spectrum, with any limit cycles eliminated. Once the integrated and demodulated C2V output signal has been digitized, processing may continue to step 810.

At step 810, the digital stage may process the received digital signal to generate a control signal in a manner that reduces the quadrature portion of the C2V output signal. The digital stage includes a variety of gain elements, filters, and signal paths, and in an embodiment, implements a second-order Sigma-Delta modulator. A compensation gain term in the initial signal path (e.g., gain $K_{FF}$) stabilizes the system (e.g., removes resonance peaks within a frequency range of interest) and is subtracted from the output of an initial first-order filter. A gain is applied to scale the output appropriately to control the capacitors (e.g., a gain of 1/16 to remove the least significant 4 bits of resolution from the 13-bit signal). An additional filter (e.g., integrator) processes this 9-bit signal to generate the control signal, which in turn controls the operation of variable capacitors connected at the sense signal inputs to the C2V amplifier. The digital stage sets the values of the control signals to drive the quadrature portion of the C2V output signal towards zero. The variable capacitance will then be implemented at an appropriate time, such as the next reset cycle. Example variable capacitors may each be capable of receiving a digital input that controls the operation of the variable capacitors, such as by modifying a configuration of an array of capacitors in a manner that corresponds to the control signal (e.g., switching particular capacitors of the array of capacitors into the active circuit and/or modifying signal paths between capacitors within the array of capacitors). Although the variable capacitors are described herein as having the same available capacitance values and responding to the same control signal, in some embodiments that variable capacitors may have different base capacitances, more than one control signal may be provided, and the variable capacitors may respond differently to a provided control signal. In some embodiments, the variable capacitors may have an initial value, for example, that is set along with the reset signal, and that corresponds to a fixed base value or previously determined capacitance values for the particular signal being sensed (e.g., previously determined variable capacitance values for a particular sense axis in a round robin scheme).

Once the digital processing is completed and the control signal has been provided, processing may continue to step 812.

At step 812, processing may be performed to measure the force of interest. Once the quadrature portion of the C2V output is removed or substantially reduced, the gain of the C2V amplifier is effectively applied to only the remaining signal portions, including the signal of interest (e.g., a Coriolis signal modulated by a drive frequency). In some embodiments, this measurement may be performed only after the quadrature portion has been reduced or removed, such as by implementing a set delay time or based on a measurement (e.g., at the integrator or ADC output) of the quadrature output signal portion. The measurement may be performed based on the output signal of the C2V converter having the quadrature portion removed. Processing may be performed to remove undesired characteristics of the output signal. In some embodiments, certain components may be shared with the quadrature cancellation circuitry, for example, by routing the signal corresponding to the force of interest to the ADC (e.g., SAR ADC) after the offset compensation has been performed. Once the signal of interest has been measured, processing may continue to return to step 804 for the next reset and measurement cycle.

Figure 9A:
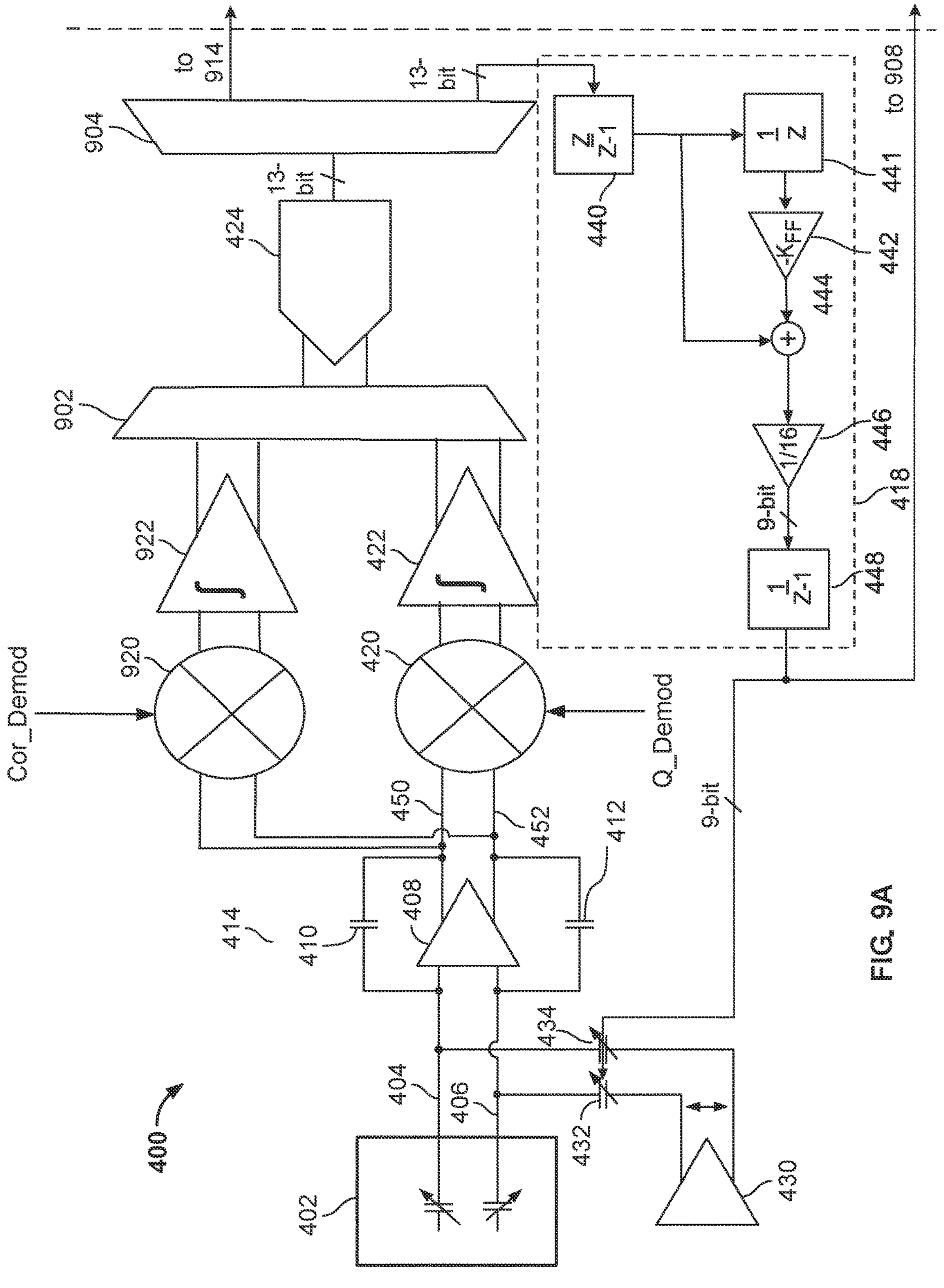
FIG. 9A depicts a first portion of a circuit diagram of an exemplary MEMS sensor including quadrature cancellation and digital compensation of an angular velocity output in accordance with an embodiment of the present disclosure.
Figure 9B:
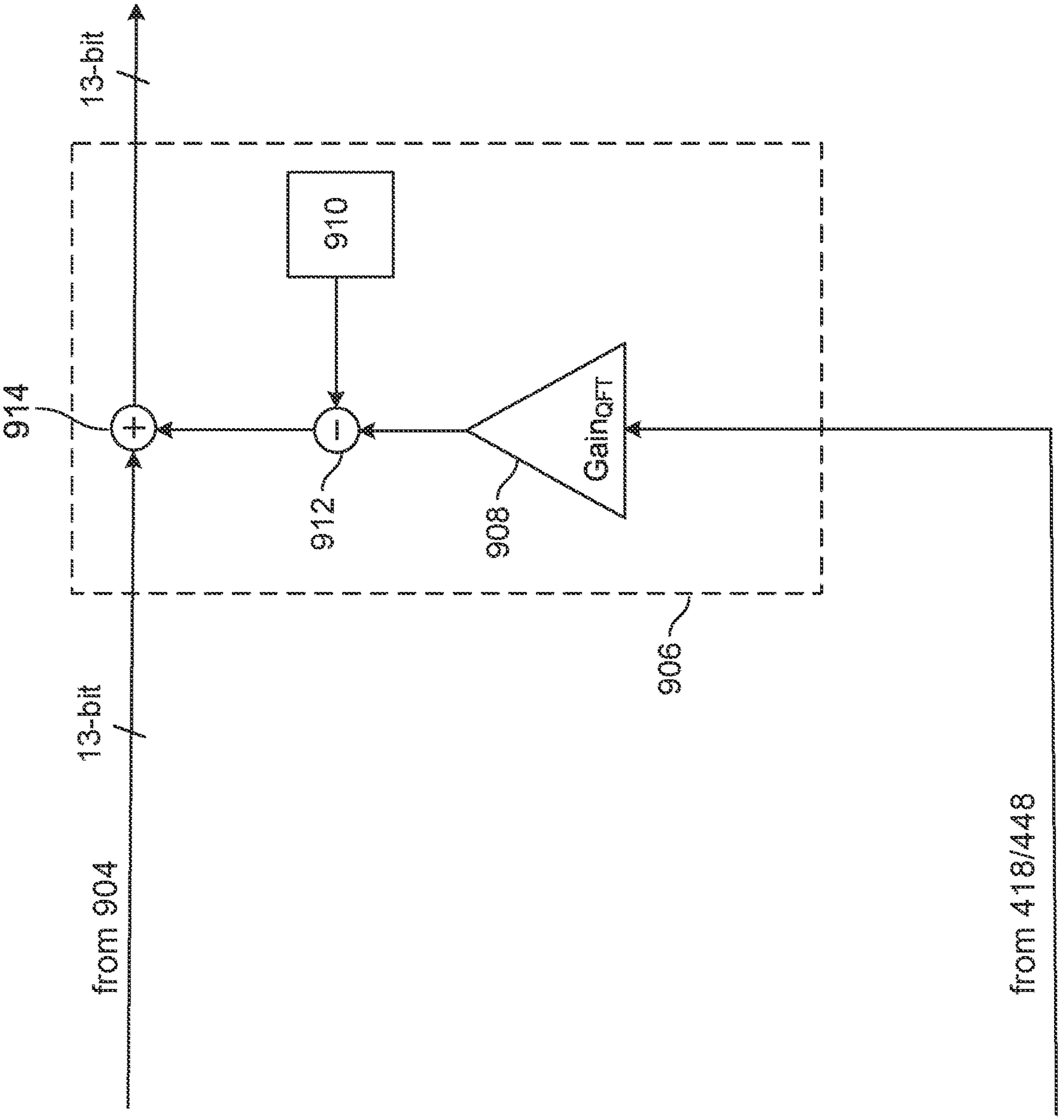
FIG. 9B depicts a second portion of a circuit diagram of an exemplary MEMS sensor including quadrature cancellation and digital compensation of an angular velocity output in accordance with an embodiment of the present disclosure.

FIG. 9A depicts a first portion of a circuit diagram of an exemplary MEMS sensor including quadrature cancellation and digital compensation of an angular velocity output in accordance with an embodiment of the present disclosure, while FIG. 9B depicts a second portion of a circuit diagram of an exemplary MEMS sensor including quadrature cancellation and digital compensation of an angular velocity output in accordance with an embodiment of the present disclosure. As is depicted in FIG. 9A, a digital output signal is provided from demultiplexer 904 of FIG. 9A to digital adder 914 of digital compensation stage 906 of FIG. 9B, while the control signal from digital stage 418 (e.g., from third filter 448 of digital stage 418) of FIG. 9A is provided to gain element 908 of digital compensation stage 906 of FIG. 9B. Although FIGS. 9A and 9B will be described in the context of a particular application and system components, it will be understood that the present disclosure may be utilized with a variety of sensors, systems, or applications where quadrature cancellation is required. Although particular components are depicted and described in FIGS. 9A and 9B, it will be understood that components may be added, removed, substituted, or modified in accordance with the present disclosure. In the example depicted in FIGS. 9A and 9B, the components of the quadrature cancellation circuitry are numbered as in FIG. 4 and operate as described herein, except that the signal path of the quadrature cancellation circuitry includes a multiplexer 902 and demultiplexer 904, that collectively allow the quadrature cancellation signal path and the angular velocity signal path to utilize a single common ADC 424 (e.g., a shared SAR ADC). Although the angular velocity processing signal path may include a variety of components, which may be added or substituted as appropriate to perform the demodulation, integration, and digital processing operations described herein, in an embodiment the angular velocity signal path includes a mixer 920, integrator 922, multiplexer 902, demultiplexer 904, and a digital compensation stage 906. Although the digital compensation stage 906 may include a variety of components which may be added or substituted as appropriate to perform compensation operations, in an embodiment the digital compensation stage includes a gain element 908, a static compensation signal 910, a subtractor 912, and adder 914.

As depicted in FIGS. 9A and 9B, the circuit path for sensing of angular velocity operates in parallel with the quadrature compensation circuit path, based on the operation of multiplexer 902 and demultiplexer 904. Mixer 920 receives the first C2V output 450 and second C2V output 452 from the C2V amplifier 408 and mixes this output signal with a Coriolis demodulation signal to output a baseband angular velocity signal. The Coriolis demodulation signal has frequency and phase that correspond to the frequency and phase of the quadrature signal (phase shifted as appropriate for any delays in the receive path and trimming), which in turn is the same frequency as the quadrature signal (e.g., modulated at the drive frequency) and 90 degrees out of phase from the quadrature signal that is mixed with the C2V amplifier 208 output by mixer 420. Both of these outputs are then provided to multiplexer 902, which selectively provides either the quadrature baseband signal from mixer 420 or the Coriolis baseband signal from mixer 920 to the ADC 424. In this manner, a common shared ADC (e.g., a 13-bit SAR ADC) may perform analog-to-digital conversion for both signal paths.

Although particular ordering and configuration of the parallel demodulation components is depicted in FIG. 9A, it will be understood that the particular ordering and configuration of components may be modified. For example, rather than multiplexing the baseband Coriolis and quadrature outputs, a single mixer may selectively have a different demodulation signal applied (e.g., at different times, the Coriolis demodulation signal or the quadrature demodulation signal) and thus output either the baseband Coriolis signal or baseband quadrature signal to a shared ADC depending upon the input demodulation signal.

Returning to the configuration of FIGS. 9A and 9B, during an initial quadrature removal stage the multiplexer 902 provides the baseband quadrature signal to the ADC 424, which digitizes the quadrature signal as described herein and provides that digitized signal to demultiplexer 904. Demultiplexer 904 selectively provides the digital output signal from ADC 424 to either the digital stage 418 for quadrature compensation or to digital compensation stage 906 for generating the digitized angular velocity output signal, while the other output is inactive. During the quadrature removal stage, the digital stage 418 outputs the control signal for adjusting the values of variable capacitors 432 and 434. This control signal is also provided to digital compensation stage 906 for generating a compensation term for modifying the digitized Coriolis signal output from ADC 424 (via demultiplexer 904). In this manner, the compensation term is generated by digital compensation stage 906 based on the control signal output from the initial quadrature removal stage of operation, and processed with digitized Coriolis signal output during the second, angular velocity sensing stage of operation.

The digital compensation stage 906 includes components that are selected based on the particular configuration of the sensing system, for example, the presence of SOC and FT capacitors (not depicted in FIGS. 9A and 9B) included in the sense path for initial trimming and compensation of the received signal from the MEMS 402 (e.g., coupled to first sense path signal line 404 and second sense path signal line 406). The components of the digital compensation stage are selected in a manner to remove any terms that cannot be readily digitally compensated in later digital processing steps, which perform a variety of compensation operations in a known manner to account for factors such as device temperature, phase shift of the C2V, phase shift of the demodulator/mixer, and the like. Accordingly, while the quadrature removal stage results in a larger gain applied to the Coriolis signal, digitally reinserting the removed quadrature term into the digital Coriolis output signal aids in performing this additional digital compensation. For example, during standard operation without dynamic quadrature removal, the quadrature and phase-induced offset errors in the output may be represented as follows:

$$\text{Offset} = (Quad0 + QuadTC) * (phaseMEMS - phaseDC2V + phaseSC2V - phaseDMD) + QFTstatic * (phaseSC2V - phaseDMD) \quad (6)$$

In the above equation (6) representing a MEMS system, Quad0 corresponds to the initial quadrature signal and QuadTC includes temperature and stress related quadrature changes. The overall quadrature term is multiplied by the various sources of phase shift, including phaseMEMS (e.g., the phase shift associated with the MEMS structure), phaseDC2V (phase delay of amplifier 430), phaseSC2V (phase delay of amplifier 408), and phaseDMD (e.g., the phase shift associated with the demodulation signal). The QFTstatic term is static compensation to the quadrature signal provided by feed-through capacitors, which is scaled based on the difference between phaseSC2V and phaseDMD. During ongoing operation, the primary term of concern is the QuadTC term. Thus, the overall offset value can be minimized by minimizing the impact of QuadTC on offset, such as by trimming the phaseDMD (adjustable phase delay of Phase Locked Loop used for demodulation) value to minimize the overall angle of the (phaseMEMS−phaseDC2V+phaseSC2V−phaseDMD) term.

To understand the impact of dynamic quadrature removal, the representation of (6) may be rewritten as follows:

$$\text{Offset} = (Quad0 + QuadTC) * (phaseMEMS - phaseDC2V) + (Quad0 + QuadTC - QFTstatic) * (phaseSC2V - phaseDMD) \quad (7)$$

In the case of dynamic quadrature cancellation as described herein, the OFTstatic term is replaced by a dynamic quadrature cancellation term OFTdyn, which in turn cancels the entire second part of the above equation as follows:

$$\text{Offset} = (Quad0 + QuadTC) * (phaseMEMS - phaseDC2V) + \cancel{(Quad0 + QuadTC - QFTdyn) * (phaseSC2V - phaseDMD)} \quad (8)$$

Equation (8), in turn, thus represents the Coriolis output from demultiplexer 904. The result is that the dominant term of the Coriolis output is the (Quad0+QuadTC)*(phaseMEMS−phaseDC2V) term, which is susceptible to changes QuadTC (e.g., due to temperature or stress during operation) based on the difficulty of trimming either phaseMEMS or phaseDC2V. Accordingly, to enable the ability to trim for QuadTC (e.g., by modifying phaseDMD), one option is to reinsert in the digital domain the quadrature signal that was dynamically removed in the analog domain, for example, by digitally modifying the offset term received from demultiplexer 904 corresponding to equation (8) based on the digital control values provided for quadrature cancellation (e.g., from digital stage 418), in order to achieve a digital signal corresponding to equations (6) and (7).

The signal to be digitally inserted is based on the difference between equation (7) (e.g., the standard offset, in which QuadTC can be removed based on tuning of phaseDMD) and equation (8) (e.g., the offset present with dynamic removal of the quadrature signal), which results in the following with cancellation of terms:

$$\text{Equation (7)} - \text{Equation (8)} = (QFTdyn - QFTstatic) * (phaseSC2V - phaseDMD) \quad (9)$$

Accordingly, to arrive at the original (trimmable for QuadIC) digital output, both OFTdyn and OFTstatic must be quantified. QFTdyn and OFTstatic can be quantified based on a respective scaling terms Kdyn for QFTdyn and Kstatic for OFTstatic multiplied by a unit capacitance Cft, where Cft is a unit feed-through capacitor located in capacitor arrays 432 and 434 and K is an integer multiple of the feed-through capacitor selected during static feedthrough trim (Kstatic) or a dynamic integer code (Kdyn) generated by dynamic digital sigma-delta compensation as described herein. Accordingly, QFTdyn and OFTstatic can be represented as follows):

$$QFTdyn = Kdyn * Cft \quad (10)$$

$$QFTstatic = Kstatic * Cft \quad (11)$$

If OFTunit is an amount of quadrature compensated by an addition of a single Cft unit capacitor, the difference equation representative of equation (7) (e.g., standard offset) minus equation (8) (e.g., offset with dynamic quadrature removal) is as follows:

$$\text{Equation (7)} - \text{Equation (8)} = (Kdyn - Kstatic) * QFTunit * (phaseSC2V - phaseDMD) \quad (12)$$

The impact of $C_{FT}$ on digital sensor output can be estimated during the initial trim procedure and should include the effect of the multiplier (phaseSC2V−phaseDMD). In other words, the digital equivalent of $QFT_{UNIT}$* (phaseSC2V−phaseDMD) can be estimated during the initial (e.g., fabrication or manufacturing) trim procedure, as can the integer multiplier Kstatic, since Kstatic represents the feedthrough trim code during static trimming of feedthrough. The remaining integer multiplier, Kdyn, corresponds to the digital code generated by the digital sigma-delta dynamic circuit (e.g., digital stage 418).

Accordingly, digital compensation stage 906 depicts digital processing to digitally derive the standard offset output corresponding to equations (6) and (7). As is depicted in FIG. 9B, the control signal output from digital stage 418 corresponds to Kdyn and is provided to gain element 908, which multiplies Kdyn by OFTunit*(phaseSC2V−phaseDMD), which is output to subtractor 912. The static compensation signal 910 corresponds to the OFTstatic term, such as Kstatic*QFTunit*(phaseSC2V−phaseDMD) as described above. This static compensation term is subtracted from the dynamic term output from gain element 908 at subtractor 910, resulting in the signal of equation (12) output from subtractor 912 to adder 914.

The first input to adder 914 is the digitized Coriolis signal, which corresponds to equation (8), while the second input to adder 914 is the digital compensation signal corresponding to equation (12). The resulting addition cancels the OFTdyn term and reinserts the QTFstatic term along and the trimmable phaseDMD, with an output corresponding to equations (6) and (7). Accordingly, trimming for QuadTC may be performed, for example, by modifying the phaseDMD term (e.g., trimming of the demodulation phase) in accordance with equations (6) and (7).

Figure 10:
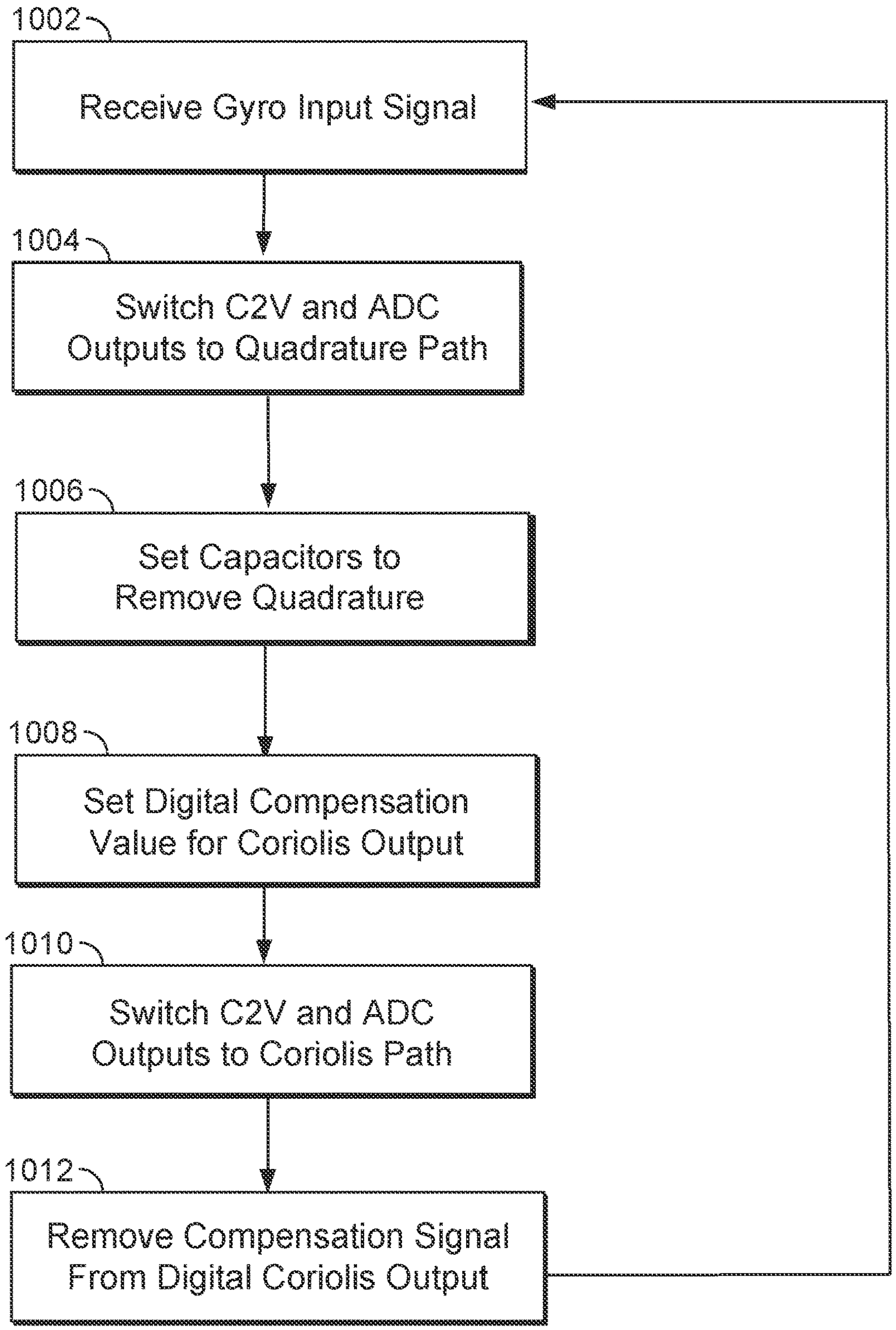
FIG. 10 depicts exemplary steps of quadrature cancellation and digital compensation of an angular velocity output in a MEMS sensor in accordance with an embodiment of the present disclosure.

FIG. 10 depicts exemplary steps of quadrature cancellation and digital compensation of an angular velocity output in a MEMS sensor in accordance with an embodiment of the present disclosure. Although particular steps are depicted in a certain order for FIG. 10, steps may be removed, modified, or substituted, and additional steps may be added in certain embodiments, and in some embodiments, the order of certain steps may be modified. Although the steps of FIG. 10 may be described in the context of certain of the implementations discussed herein, it will be understood that these steps may be applied to all of the implementations disclosed in the present disclosure.

At step 1002, the processing circuitry (e.g., a C2V amplifier and associated feed-through and variable capacitors) may receive an input signal from a MEMS sensor such as MEMS gyroscope. Step 1002 may represent the beginning of a single sensing cycle, e.g., before the dynamic quadrature cancellation has been performed for the particular cycle (e.g., the variable capacitors may be set or may be set to an initial value based on prior sensing cycles). Additional processing such as resetting of the C2V amplifier may also be performed at step 1002. Once processing is initiated with a received MEMS output signal at step 1002, processing may continue to step 1004.

At step 1004, the dynamic quadrature compensation path may be switched into the C2V to ADC circuit path, for example, by one or multiplexers and/or demultiplexers switching the quadrature demodulator into the circuit path and the ADC outputting the digital representation of the baseband quadrature signal to a digital stage. The digital stage may be a digital sigma-delta modulator that generates a control signal to dynamically remove the quadrature signal from the C2V amplifier output. Processing may then continue to step 1006.

At step 1006, the variable capacitors may be modified based on the control signal, substantially removing the quadrature signal from the C2V amplifier output as described herein. Processing may then continue to step 1008, at which the control signal is utilized to calculate a digital compensation term to be combined with the Coriolis output signal and enable ongoing trimming of the Coriolis output such as based on demodulation phase, as described herein. Processing may then continue to step 1010.

At step 1010, the Coriolis processing path may be switched into the C2V to ADC circuit path, for example, by one or multiplexers and/or demultiplexers switching the Coriolis demodulator into the circuit and the ADC outputting the digital representation of the baseband Coriolis signal (e.g., with quadrature dynamically removed) to a Coriolis digital compensation stage. Processing then continues to step 1012, at which the digital compensation stage injects a digital representation of the quadrature signal back into the Coriolis signal to facilitate trimming, such as of the demodulation phase to reduce quadrature effects due to change in temperature or stress conditions. In this manner, the quadrature may be removed at the C2V amplifier to enable a greater gain to be applied to the Coriolis signal, without sacrificing trimming techniques such as modification of demodulation phase. Processing may then return to step 1002 for the next sensing cycle.

The foregoing description includes exemplary embodiments in accordance with the present disclosure. These examples are provided for purposes of illustration only, and not for purposes of limitation. It will be understood that the present disclosure may be implemented in forms different from those explicitly described and depicted herein and that various modifications, optimizations, and variations may be implemented by a person of ordinary skill in the present art, consistent with the following claims.

What is claimed is:

1. A method for cancelling a quadrature component of a sensed signal of a microelectromechanical system (MEMS) gyroscope, comprising:

receiving, at an input of a capacitance-to-voltage (C2V) amplifier, the sensed signal, wherein the sensed signal corresponds to a movement of one or more components of a MEMS structure;

outputting, from the C2V amplifier, a C2V output signal;

extracting, from the C2V output signal, a quadrature portion of the C2V output signal;

integrating the quadrature portion of the C2V output signal;

digitizing the integrated quadrature portion;

generating, by digital processing circuitry, a variable capacitor control signal based on the digitized integrated quadrature portion, wherein the variable capacitor control signal is generated to reduce the quadrature portion of the C2V output signal; and providing, from the digital processing circuitry to one or more variable quadrature cancellation capacitors, the variable capacitor control signal, wherein the one or more variable quadrature cancellation capacitors are coupled to the C2V amplifier to modify the received sensed signal, and wherein the quadrature component of the sensed signal is cancelled based on the capacitances of the one or more variable quadrature cancellation capacitors.

2. The method of claim 1, wherein receiving the sensed signal comprises receiving a first differential signal and a second differential signal, wherein the one or more variable quadrature cancellation capacitors comprise at least one first variable quadrature cancellation capacitor coupled to a first signal path for the first differential signal and at least one second variable quadrature cancellation capacitor coupled to a second signal path for the second differential signal.

3. The method of claim 2, further comprising providing a drive signal to each of the at least one first variable quadrature cancellation capacitor and the at least one second variable quadrature cancellation capacitor.

4. The method of claim 3, wherein a first frequency of the drive signal corresponds to a second frequency of a drive of the MEMS gyroscope.

5. The method of claim 4, wherein a first phase of the drive signal corresponds to a second phase of the quadrature component.

6. The method of claim 1, wherein extracting the quadrature portion of the C2V output signal comprises mixing the C2V output signal with a quadrature demodulation signal.

7. The method of claim 6, wherein the quadrature demodulation signal has a first phase and a first frequency that correspond to a second phase and a second frequency of the quadrature portion of the C2V output signal.

8. The method of claim 6, wherein integrating the quadrature portion of the C2V output signal comprises integrating the quadrature portion of the C2V output signal.

9. The method of claim 8, wherein digitizing the integrated quadrature portion comprises:

receiving, at a successive-approximation-register (SAR) analog-to-digital converter (ADC), the integrated quadrature portion; and outputting, from the SAR ADC, the digitized integrated quadrature portion.

10. The method of claim 9, wherein the digital processing circuitry performs a second-order sigma-delta modulation on the digitized integrated quadrature portion.

11. The method of claim 1, wherein the digital processing circuitry identifies a relationship between a change in a capacitance of the one or more variable quadrature cancellation capacitors with a change in the digitized integrated quadrature portion.

12. The method of claim 11, wherein the digital processing circuitry provides the variable capacitor control signal based on a resolution of the one or more variable quadrature cancellation capacitors.

13. The method of claim 1, wherein the sensed signal is a multiplexed sensed signal, further comprising selectively coupling one of a plurality of gyroscope capacitance signals to provide the sensed signal.

14. The method of claim 13, further comprising modifying the variable capacitor control signal based on which of the plurality of gyroscope capacitance signals is selectively coupled to provide the sensed signal.

15. The method of claim 1, further comprising, after the providing of the variable capacitor control signal, determining an angular velocity associated with the MEMS gyroscope based on the C2V output signal.

16. The method of claim 15, further comprising, after the determining of the angular velocity, resetting the C2V amplifier.

17. The method of claim 1, wherein the digitizing further comprises injecting random noise into the digitized integrated quadrature portion.

18. The method of claim 1, wherein the random noise comprises a pseudo random binary sequence.

19. A microelectromechanical system (MEMS) gyroscope, comprising:

a MEMS structure, wherein a sensed capacitive signal associated with the MEMS structure changes based on a sensed angular velocity;

a capacitance-to-voltage (C2V) amplifier, comprising an input coupled to the MEMS structure to receive the sensed capacitive signal;

a demodulator coupled to an output of the C2V amplifier, wherein the demodulator is configured to demodulate a portion of the output of the C2V amplifier associated with a quadrature portion of the sensed capacitive signal;

an integrator coupled to the demodulator to integrate an output signal of the demodulator;

an analog-to-digital converter (ADC) coupled to the demodulator to digitize an output of the integrator;

digital processing circuitry coupled to an output of the ADC, wherein the digital processing circuitry is configured to generate a variable capacitor control signal based on the output of the ADC, wherein the variable capacitor control signal is generated to reduce the quadrature portion; and at least one variable capacitor coupled to an output of the ADC and the input of the C2V amplifier, wherein the at least one variable capacitor receives the variable capacitor control signal from the digital processing circuitry, and wherein the quadrature portion of the sensed capacitive signal is cancelled based on a capacitance of the at least one variable capacitor.

20. A processing circuitry of a microelectromechanical system (MEMS) gyroscope, comprising:

a capacitance-to-voltage (C2V) amplifier, comprising an input coupled to an output of a MEMS structure to receive a sensed capacitive signal from the MEMS structure;

a demodulator coupled to an output of the C2V amplifier, wherein the demodulator is configured to demodulate a portion of the output of the C2V amplifier associated with a quadrature portion of the sensed capacitive signal;

an integrator coupled to the demodulator to integrate an output signal of the demodulator;

an analog-to-digital converter (ADC) coupled to the demodulator to digitize an output of the integrator;

digital processing circuitry coupled to an output of the ADC, wherein the digital processing circuitry is configured to generate a variable capacitor control signal based on the output of the ADC, wherein the variable capacitor control signal is generated to reduce the quadrature portion; and at least one variable capacitor coupled to an output of the digital processing circuitry and the input of the C2V amplifier, wherein the at least one variable capacitor receives the variable capacitor control signal from the digital processing circuitry, and wherein the quadrature portion of the sensed capacitive signal is cancelled based on a capacitance of the at least one variable capacitor.

* * * * *